United States Patent
Braggin et al.

(10) Patent No.: US 9,297,374 B2
(45) Date of Patent: Mar. 29, 2016

(54) METHOD AND SYSTEM FOR PUMP PRIMING

(75) Inventors: Jennifer M. Braggin, Somerville, MA (US); Shiho Inui, Tokyo (JP); Wailup Chow, Singapore (SG); Aiwen Wu, Malden, MA (US)

(73) Assignee: Entegris, Inc., Billerica, MA (US)

( * ) Notice: Subject to any disclaimer, the term of this patent is extended or adjusted under 35 U.S.C. 154(b) by 330 days.

(21) Appl. No.: 13/277,684

(22) Filed: Oct. 20, 2011

(65) Prior Publication Data

US 2012/0128505 A1 May 24, 2012

Related U.S. Application Data

(60) Provisional application No. 61/405,055, filed on Oct. 20, 2010.

(51) Int. Cl.
*F04B 43/12* (2006.01)
*F04B 49/06* (2006.01)
(Continued)

(52) U.S. Cl.
CPC .............. *F04B 49/065* (2013.01); *F04B 53/20* (2013.01); *F04D 13/06* (2013.01); *H01L 21/67017* (2013.01)

(58) Field of Classification Search
CPC .. F04B 1/02; F04B 2205/0801; F04B 49/065; F04D 13/06
USPC .................. 417/53, 199.2, 200, 26, 237, 313; 222/72, 189.06, 189.09, 189.11; 137/884
See application file for complete search history.

(56) References Cited

U.S. PATENT DOCUMENTS 3,660,200 A 5/1972 Anderson et al.
4,605,591 A 8/1986 Nose et al.
(Continued)

FOREIGN PATENT DOCUMENTS

CN 1993171 A 7/2007
CN 101155992 A 4/2008
(Continued)

OTHER PUBLICATIONS

Office Action for U.S. Appl. No. 12/714,148, mailed Apr. 5, 2012, 10 pgs.
(Continued)

*Primary Examiner* — Peter J Beretheaud
(74) *Attorney, Agent, or Firm* — Sprinkle IP Law Group

(57) ABSTRACT

Systems and methods relating to filtration in a pump are described. Even more particularly, systems and methods relate to optimizing operating routines of a pump based on the filter used with the pump. A system controlling a pump can receive filter information and process fluid information and select a priming routine for the filter based on the filter information and process fluid information. The pump can be operated according to the selected priming routine that includes a back pressure step to pressurize the filter from downstream. Systems and methods relating to filtration in a pump are described. Even more particularly, systems and methods relate to optimizing operating routines of a pump based on the filter used with the pump. A system controlling a pump can receive filter information and process fluid information and select a priming routine for the filter based on the filter information and process fluid information. The pump can be operated according to the selected priming routine that includes a back pressure step to pressurize the filter from downstream.

20 Claims, 21 Drawing Sheets

(51) Int. Cl.
  *F04D 13/06*       (2006.01)
  *F04B 53/20*       (2006.01)
  *H01L 21/67*       (2006.01)

(56) References Cited

U.S. PATENT DOCUMENTS

| | | | |
|---|---|---|---|
| 4,699,298 A | 10/1987 | Grant et al. | |
| 4,827,110 A | 5/1989 | Rossi et al. | |
| 4,891,254 A | 1/1990 | Bianco | |
| 4,965,933 A | 10/1990 | Mraz et al. | |
| 5,108,015 A | 4/1992 | Rauworth et al. | |
| 5,134,962 A | 8/1992 | Amada et al. | |
| 5,152,057 A | 10/1992 | Murphy | |
| 5,194,327 A | 3/1993 | Takahashi et al. | |
| 5,203,060 A | 4/1993 | Mraz et al. | |
| 5,222,867 A * | 6/1993 | Walker et al. | 417/12 |
| 5,344,703 A | 9/1994 | Kovar et al. | |
| 5,389,769 A | 2/1995 | Yamashita et al. | |
| 5,420,757 A | 5/1995 | Eberhardt et al. | |
| 5,443,369 A * | 8/1995 | Martin et al. | 417/53 |
| 5,448,110 A | 9/1995 | Tuttle et al. | |
| 5,482,441 A * | 1/1996 | Permar | 417/216 |
| 5,526,956 A | 6/1996 | Osgar | |
| 5,528,222 A | 6/1996 | Moskowitz et al. | |
| 5,762,795 A * | 6/1998 | Bailey et al. | 210/416.1 |
| 5,779,839 A | 7/1998 | Tuttle et al. | |
| 5,811,197 A | 9/1998 | Nishiyama et al. | |
| 5,953,682 A | 9/1999 | McCarrick et al. | |
| 5,957,328 A | 9/1999 | Osgar | |
| 5,973,600 A | 10/1999 | Mosher, Jr. | |
| 5,986,569 A | 11/1999 | Mish et al. | |
| 6,013,949 A | 1/2000 | Tuttle | |
| 6,015,068 A | 1/2000 | Osgar et al. | |
| 6,025,054 A | 2/2000 | Tiffany, III | |
| 6,027,027 A | 2/2000 | Smithgall | |
| 6,045,000 A | 4/2000 | Rauworth et al. | |
| 6,100,804 A | 8/2000 | Brady et al. | |
| 6,147,662 A | 11/2000 | Grabau et al. | |
| 6,164,530 A | 12/2000 | Cheesebrow et al. | |
| 6,177,859 B1 | 1/2001 | Tuttle et al. | |
| 6,190,565 B1 * | 2/2001 | Bailey et al. | 210/744 |
| 6,195,007 B1 | 2/2001 | Takayama et al. | |
| 6,206,282 B1 | 3/2001 | Hayes, Sr. et al. | |
| 6,209,592 B1 | 4/2001 | Gilboa et al. | |
| 6,248,199 B1 | 6/2001 | Smulson | |
| 6,254,767 B1 * | 7/2001 | Shin et al. | 210/85 |
| 6,255,949 B1 | 7/2001 | Nicholson et al. | |
| 6,259,367 B1 | 7/2001 | Klein | |
| 6,302,461 B1 | 10/2001 | Debras et al. | |
| 6,303,036 B1 | 10/2001 | Collins et al. | |
| 6,325,294 B2 | 12/2001 | Tuttle et al. | |
| 6,330,971 B1 | 12/2001 | Mabry et al. | |
| 6,340,932 B1 | 1/2002 | Rodgers et al. | |
| 6,451,154 B1 | 9/2002 | Grabau et al. | |
| 6,483,434 B1 | 11/2002 | UmiKer | |
| 6,522,549 B2 | 2/2003 | Kano et al. | |
| 6,609,041 B1 | 8/2003 | Sanka et al. | |
| 6,661,339 B2 | 12/2003 | Muirhead | |
| 6,718,888 B2 | 4/2004 | Muirhead | |
| 6,720,865 B1 | 4/2004 | Forster et al. | |
| 6,720,877 B2 | 4/2004 | Lian et al. | |
| 6,758,000 B2 | 7/2004 | Sandt et al. | |
| 6,771,981 B1 | 8/2004 | Zalewski et al. | |
| 6,778,089 B2 | 8/2004 | Yoakum | |
| 6,816,076 B2 | 11/2004 | Pomes | |
| 6,879,876 B2 | 4/2005 | O'Dougherty et al. | |
| 6,886,246 B2 | 5/2005 | Chung | |
| 6,900,536 B1 | 5/2005 | Derbenwick et al. | |
| 6,943,678 B2 | 9/2005 | Muirhead | |
| 7,029,238 B1 | 4/2006 | Zagars et al. | |
| 7,152,781 B2 | 12/2006 | O'Dougherty et al. | |
| 7,273,172 B2 | 9/2007 | Olsen, III et al. | |
| 7,370,791 B2 | 5/2008 | O'Dougherty et al. | |
| 7,456,418 B1 | 11/2008 | Stevens et al. | |
| 7,476,087 B2 | 1/2009 | Zagars et al. | |
| 7,547,049 B2 | 6/2009 | Gashgaee | |
| 7,850,431 B2 | 12/2010 | Gonnella et al. | |
| 7,878,765 B2 | 2/2011 | Gonnella et al. | |
| 7,897,196 B2 | 3/2011 | Cedrone et al. | |
| 8,684,705 B2 * | 4/2014 | Magoon | G05D 7/0617 210/739 |
| 8,727,744 B2 * | 5/2014 | Magoon | F04B 23/06 210/739 |
| 2002/0124945 A1 | 9/2002 | Muir et al. | |
| 2002/0139738 A1 * | 10/2002 | Fujie et al. | 210/184 |
| 2002/0187025 A1 | 12/2002 | Speasl et al. | |
| 2003/0010387 A1 | 1/2003 | Rauworth et al. | |
| 2003/0135388 A1 | 7/2003 | Martucci et al. | |
| 2003/0180471 A1 | 9/2003 | Takekuma et al. | |
| 2003/0235027 A1 | 12/2003 | Smeyak et al. | |
| 2004/0041709 A1 | 3/2004 | Forster | |
| 2004/0094949 A1 | 5/2004 | Savagian et al. | |
| 2004/0168618 A1 | 9/2004 | Muirhead | |
| 2004/0238623 A1 | 12/2004 | Asp | |
| 2004/0262404 A1 | 12/2004 | Fujiki et al. | |
| 2005/0012620 A1 | 1/2005 | Yoakum | |
| 2005/0066563 A1 | 3/2005 | Juhan et al. | |
| 2005/0068182 A1 | 3/2005 | Dunlap et al. | |
| 2005/0099303 A1 | 5/2005 | Zuckerman | |
| 2005/0128086 A1 | 6/2005 | Brown et al. | |
| 2005/0184087 A1 * | 8/2005 | Zagars et al. | 222/63 |
| 2005/0197074 A1 | 9/2005 | Cullen et al. | |
| 2005/0199700 A1 | 9/2005 | Baker et al. | |
| 2005/0205658 A1 | 9/2005 | Baker et al. | |
| 2005/0237184 A1 | 10/2005 | Muirhead | |
| 2005/0237195 A1 | 10/2005 | Urban | |
| 2005/0241548 A1 | 11/2005 | Muirhead | |
| 2005/0280542 A1 | 12/2005 | Schieh | |
| 2005/0285735 A1 | 12/2005 | Imura et al. | |
| 2006/0060512 A1 | 3/2006 | Astle et al. | |
| 2006/0283932 A1 | 12/2006 | Asp et al. | |
| 2007/0104586 A1 | 5/2007 | Cedrone et al. | |
| 2007/0125797 A1 | 6/2007 | Cedrone et al. | |
| 2007/0128046 A1 | 6/2007 | Gonnella et al. | |
| 2007/0128048 A1 | 6/2007 | Gonnella et al. | |
| 2007/0128050 A1 | 6/2007 | Cedrone et al. | |
| 2007/0272327 A1 | 11/2007 | Lin | |
| 2008/0131290 A1 | 6/2008 | Magoon et al. | |
| 2008/0135498 A1 | 6/2008 | Bright et al. | |
| 2008/0175719 A1 * | 7/2008 | Tracey et al. | 417/38 |
| 2009/0045140 A1 | 2/2009 | Zahka et al. | |
| 2009/0047143 A1 | 2/2009 | Cedrone et al. | |
| 2009/0132094 A1 | 5/2009 | Laverdiere et al. | |
| 2010/0247775 A1 | 9/2010 | Thomas et al. | |
| 2010/0262304 A1 | 10/2010 | Gonnella et al. | |
| 2011/0098864 A1 | 4/2011 | Gonnella et al. | |
| 2011/0211975 A1 | 9/2011 | Magoon et al. | |
| 2011/0211976 A1 | 9/2011 | Magoon et al. | |
| 2014/0222222 A1 | 8/2014 | Magoon et al. | |

FOREIGN PATENT DOCUMENTS

| | | |
|---|---|---|
| CN | 101495756 | 7/2009 |
| CN | 101583796 | 11/2009 |
| DE | 10156927 | 6/2003 |
| EP | 0855675 A2 | 7/1998 |
| GB | 2424928 | 10/2005 |
| JP | 11354426 | 12/1990 |
| JP | 03114565 | 5/1991 |
| JP | 2001082407 | 3/2001 |
| JP | 2001353640 | 12/2001 |
| JP | 2002-024783 A | 1/2002 |
| JP | 2002-183695 A | 6/2002 |
| JP | 2002531237 | 9/2002 |
| JP | 2002-298116 A | 10/2002 |
| JP | 2002311601 | 10/2002 |
| JP | 2003324059 | 11/2003 |
| JP | 2004148299 A | 5/2004 |
| JP | 2006095882 A | 4/2006 |
| JP | 2008520908 A | 6/2006 |
| JP | 2007286051 A | 11/2007 |
| JP | 2008041791 A | 2/2008 |
| JP | 2008539075 | 11/2008 |
| JP | 2009-018308 | 1/2009 |

(56) References Cited

FOREIGN PATENT DOCUMENTS

| | | |
|---|---|---|
| JP | 2009517888 A | 4/2009 |
| JP | 2009518580 | 5/2009 |
| WO | WO 94/18700 A1 | 8/1994 |
| WO | WO2007067360 | 6/1997 |
| WO | WO 00/02236 A2 | 1/2000 |
| WO | WO 00/21030 A1 | 4/2000 |
| WO | WO0032298 | 6/2000 |
| WO | WO 00/43952 A1 | 7/2000 |
| WO | WO 01/40646 A2 | 6/2001 |
| WO | WO 02/056344 A2 | 7/2002 |
| WO | WO 03/060818 A2 | 7/2003 |
| WO | WO 2005/081182 A2 | 9/2005 |
| WO | WO2006057957 | 6/2006 |
| WO | WO2007067342 | 6/2007 |
| WO | WO 2009/059324 A2 | 5/2009 |

OTHER PUBLICATIONS

Office Action for U.S. Appl. No. 12/714,126, mailed Apr. 16, 2012, 11 pgs.
International Preliminary Report on Patentability issued for PCT Application No. PCT/US2011/057061, mailed May 2, 2012, 5 pages.
Wu, A., and Chow, W., "A technique for rapid elimination of microbubbles for photochemical filter startup", SPIE vol. 7140, 110, 2008, 9 pgs.
Mykrolis; Optimizer II ST Manifold; "The Solution for Rapid Filter Changeout", Product Profile, 2004, 2 pgs.
LGInternational Identification Technologies, The FIM Process Illustrated two-page printout from website, Copyright 2001, 2 pgs.
LGInternational Identification Technologies, "Our FIM system is setting the standard for the rest of the industry" two-page printout from website, Copyright, 2001.
Modern Plastics, "RFID is here—is it time for you to worry?," Dec. 2004, p. 66-67.
International Search Report and Written Opinion for PCT Patent Application No. PCT/US2011/025403, mailed Jun. 14, 2011, 11 pgs.
International Search Report and Written Opinion for PCT Patent Application No. PCT/US2011/025402, mailed Jul. 14, 2011, 10 pgs.
International Preliminary Report on Patentability issued for PCT Application No. PCT/US2011/025402, mailed Sep. 7, 2012, 8 pages.
International Preliminary Report on Patentability issued for PCT Application No. PCT/US2011/025403, mailed Sep. 7, 2012, 9 pages.
Notice of Allowance issued in U.S. Appl. No. 12/714,148, mailed Nov. 8, 2013, 5 pages.
Notice of Allowance issued in U.S. Appl. No. 12/714,126, mailed Nov. 7, 2013, 5 pages.
International Search Report and Written Opinion issued for PCT Application No. PCT/US2011/057061, mailed May 11, 2012, 8 pages.
Final Office Action issued for U.S. Appl. No. 12/714,148, mailed Nov. 21, 2012, 10 pages.
Final Office Action issued for U.S. Appl. No. 12/714,126, mailed Dec. 3, 2012, 10 pages.
Office Action issued for Chinese Patent Application No. 201180010843.4, mailed Apr. 1, 2014, 22 pages.
Office Action for Chinese Patent Application No. 201180010852.3, mailed Apr. 25, 2014, 22 pages.
Office Action issued for Taiwan Patent Application No. 100106551, mailed Jul. 17, 2015, 6 pages.
Office Action issued for U.S. Appl. No. 14/175,573, mailed Aug. 13, 2015, 6 pages.
Notice of Allowance issued for Chinese Patent Application No. 201180010843.4, mailed Sep. 18, 2015, 2 pages.
Notice of Allowance issued for Taiwanese Patent Application No. 100106550, mailed Sep. 30, 2015, 3 pages.
Office Action issued for Chinese Patent Application No. 201180010843.4, mailed Nov. 3, 2014, 7 pages.
Office Action issued for Japanese Patent Application No. 2012-555055, mailed Nov. 4, 2014, 7 pages.
Notice of Allowance issued for Chinese Patent Application No. ZL201180010852.3, mailed Jan. 13, 2015, 2 pages.
Office Action issued for Chinese Patent Application No. 201180056846.1, mailed Mar. 18, 2015, 10 pages.
Office Action issued for Chinese Patent Application No. 201180010843.4, mailed Mar. 24, 2015, 10 pages.
Notice of Allowance issued for Japanese Patent Application No. 2012-555055, mailed Apr. 6, 2015, 2 pages.
Office Action issued for Japanese Patent Application No. 2012-555054, mailed Oct. 20, 2014, 7 pages.
Notice of Allowance issued for Japanese Patent Application No. 2013-535081, mailed on May 28, 2015, 3 pages.
Office Action issued for Taiwanese Patent Application No. 100106550, mailed May 29, 2015, 9 pages.
Notice of Allowance issued for Japanese Patent Application No. 2012-555054, mailed Jun. 5, 2015, 3 pages.
Examination Report issued for European Patent Application No. 11712362.0, mailed Sep. 9, 2014, 5 pages.
Notice of Allowance issued for Chinese Patent Application No. 201180056846.1, mailed Nov. 27, 2015, 2 pages.
Notice of Allowance issued for U.S. Appl. No. 14/175,573, mailed Jan. 19, 2016, 6 pages.

* cited by examiner

| SYSTEM SEGMENT NAME | SYSTEM SEGMENT NUMBER | VALVE DELAY NUMBER | FORWARD | REVERSE | DISPENSE | FORWARD | REVERSE | INLET | PURGE | VENT | ISOLATE | BARRIER |
|---|---|---|---|---|---|---|---|---|---|---|---|---|
| READY | | | | | | | | | | | | |
| OPEN ADJ | 1 | | | | ▨ | | | | | | | |
| DISPENSE AND FILL | 2 | | ▨ | | ▨ | | | | | | | |
| DISPENSE AND FILL | 3 | | ▨ | | ▨ | | | | | | | |
| DISPENSE AND FILL | 4 | | ▨ | | ▨ | | | | | | | |
| DISPENSE AND FILL | 5 | | ▨ | | ▨ | | | | | | | |
| DISPENSE AND FILL | 6 | | ▨ | | ▨ | | | | | | | |
| CLOSE ADJ | 7 | | | | ▨ | | ▨ | | | | | |
| END FILL | 8 | | | | | | ▨ | | | | | |
| | 9 | 0 | | | | | ▨ | ▨ | | | | |
| | 10 | 1 | | | | | | ▨ | | | | ▨ |
| | 11 | 2 | | | | | | ▨ | | | | ▨ |
| | 12 | 3 | | | | | | | ▨ | | | ▨ |
| PRE FILTR | 13 | | | | | ▨ | | | ▨ | | | ▨ |
| FILTRATION | 14 | | | ▨ | | ▨ | | | ▨ | | | ▨ |
| | 15 | 4 | | | | | | | ▨ | | ▨ | ▨ |
| | 16 | 5 | | | | | | | ▨ | | ▨ | |
| VENT | 17 | | | | | ▨ | | | ▨ | | ▨ | |
| | 18 | 6 | | | | | | | ▨ | | ▨ | |
| PRS ZERO A | 19 | 7 | | | | | | | ▨ | | ▨ | |
| | 20 | 8 | | | | | | ▨ | ▨ | | ▨ | |
| | 21 | 9 | | | | | | ▨ | ▨ | | ▨ | |
| | 22 | 10 | | | | | | ▨ | ▨ | | | ▨ |
| | 23 | 11 | | | | | | ▨ | ▨ | ▨ | | ▨ |
| | 24 | 12 | ▨ | | | | | ▨ | ▨ | ▨ | | ▨ |
| PURGE | 25 | | | | | | | ▨ | ▨ | ▨ | | ▨ |
| ST PRG | 26 | 13 | | | | | | ▨ | ▨ | | | ▨ |
| PRS ZERO B | 27 | 14 15 | | | | | | ▨ | ▨ | | | ▨ |
| | 28 | 15 | | | | | | ▨ | | | | ▨ |
| P.C. 2A | 29 | | | | ▨ | | | | | | | |

| System Segment Name | Segment Number | Valve Delay Number | | | | Inlet Valve | Outlet Valve | Purge Valve | Vent Valve | Isolation Valve | Barrier Valve |
|---|---|---|---|---|---|---|---|---|---|---|---|
| | | DISPENSE | | FEED | | | | | | | |
| | | FORWARD | REVERSE | FORWARD | REVERSE | | | | | | |
| RECHARGE CONTINUED — BARRIER VALVE CLOSE | 17 | | | | | | | | | ▓ | |
| RECHARGE CONTINUED — ISOLATE VALVE CLOSE | 18 | | | | ▓ | | | | | | |
| RECHARGE CONTINUED — PURGE | 19 | ▓ | | | ▓ | | | | | | |
| RECHARGE CONTINUED — PRESSURE RELIEF | 20 | | | | ▓ | | | ▓ | | | |
| RECHARGE CONTINUED — PURGE VALVE CLOSE | 21 | | | | ▓ | | | | | | |
| RECHARGE CONTINUED — PRESSURE SETTING | 22 | | | ▓ | ▓ | | | | | | |
| READY — FILL | 23 | | | | ▓ | ▓ | | | | | |
| READY | 24 | | | | | ▓ | | | | | |
| READY | 25 | | | | | ▓ | | ▓ | | | |
| READY | 26 | | | | | ▓ | | ▓ | | | |
| READY | 27 | | | | | | | ▓ | | | |
| READY — VENT | 28 | | | ▓ | | | | ▓ | | | |
| READY | 29 | | | | | ▓ | | ▓ | | | |
| READY | 30 | | | | | ▓ | | ▓ | | | |
| READY | 31 | | | | | ▓ | | | ▓ | | |
| READY | 32 | | | | | ▓ | | | | | |
| READY | 33 | | | | | ▓ | | | | | |
| READY | | | | | | ▓ | | | | | |

TIME →

METHOD AND SYSTEM FOR PUMP PRIMING

RELATED APPLICATIONS

The present application claims the benefit of priority under 35 USC 119(e) to United States Provisional Patent Application No. 61/405,055, entitled "Method and System for Pump Priming," to Braggin et al., filed Oct. 20, 2010, which is hereby fully incorporated by reference herein.

TECHNICAL FIELD

This disclosure relates to systems and methods for priming dispense systems used in semiconductor manufacture. More particularly, embodiments described herein relate to priming dispense systems based on the type of filter and process fluid used.

BACKGROUND

There are many applications for which precise control over the amount and/or rate at which a fluid is dispensed by a dispensing apparatus is necessary. In semiconductor processing, for example, it is important to control the amount and rate at which photochemicals, such as photoresist chemicals, are applied to a semiconductor wafer. The coatings applied to semiconductor wafers during processing typically require a uniformity of thickness across the surface of the wafer that is measured in angstroms. The rates at which processing chemicals are applied to the wafer must be controlled in order to ensure that the processing liquid is applied uniformly.

Many photochemicals used in the semiconductor industry today are very expensive, frequently costing upwards of $1000 a liter. Therefore, it is preferable to ensure that chemical processing equipment is operating correctly. Additionally, it is desirable to reduce the cycle time for dispensing fluid on a wafer.

Many current photochemical dispense systems utilize filters to remove impurities from the process fluid. In such systems, the filter must be primed to fully wet the filter and multiple dispenses performed to flush all the air out of the filter before the pump is ready for production dispenses. It can take hours of dispense cycles before the pump is ready. Each non-production dispense cycle that occurs leads to wasted fluid and machine time.

SUMMARY OF THE DISCLOSURE

Embodiments described herein provide systems and methods for controlling the operation of a pump to perform a filter priming cycle. The filter priming cycle can be optimized for a process fluid and filter type. By optimizing the priming routine, the number of dispense cycles needed before a pump is ready to dispense fluid to wafers is minimized. In particular, embodiments described herein can include priming routines optimized for multiple membrane filters. Even more particularly, the priming routines can involve a back pressure stage in which the filter is pressurized from downstream for a period of time and a back flush stage in which the filter is flushed from downstream. Such priming routines have been found to be beneficial for use with multiple membrane filters.

One embodiment described herein can include a dispense system for semiconductor manufacturing that has one or more motors to draw fluid into an inlet of the pump and dispense fluid from an outlet of the pump. The pump can further include a removable filter disposed in a fluid flow path between the pump inlet and the pump outlet and a pump controller. The pump controller can be configured to select a priming routine from a set of priming routines based on a filter type and process fluid. The set of priming routines can include a first priming routine that includes a forward pressurization segment for a first type of removable filter and a second priming routine for that includes a back pressurization segment for a second type of removable filter. The pump controller can control the pump to perform the selected priming routine to prime the removable filter.

According to one embodiment, the pump controller can select the first priming routine for a first type of removable filter and select the second priming routine for a second type of removable filter. According to one embodiment, the first type of removable filter has a single filter membrane and the second type of removable filter has multiple filter membranes. Controlling the pump to perform the selected priming routine when the second priming routine is selected can include introducing a process fluid to the removable filter and back-pressurizing the removable filter for a predetermined period of time. According to one embodiment, the pump controller can be configured to back pressurize the removable filter for 5-10 minutes at 5-25 psi.

Another embodiment can include a method for priming a pump including the steps of connecting a removable filter to the pump, selecting a priming routine for the removable filter based on a filter type and process fluid and operating the pump according to the selected priming routine. Operating the pump according to the selected priming routine can include introducing a process fluid to the removable filter and back-pressurizing the removable filter for a predetermined period of time.

Yet another embodiment can include a computer program product comprising a non-transitory storage medium storing a set of computer executable instructions. The instructions can be executable to receive filter information (e.g., from a tag reader, storage, user input or otherwise receive the filter information) and process fluid information, select a priming routine for the removable filter based on the filter information and process fluid information and operate a pump according to the selected priming routine. Operating the pump according to the selected priming routine can include introducing a process fluid to the removable filter and back-pressurizing the removable filter for a predetermined period of time.

Another embodiment can include a dispense system having a pump and a pump management system. The pump can include one or more motors to draw fluid into an inlet of the pump and dispense fluid from an outlet of the pump, a removable filter in a fluid flow path between the pump inlet and pump outlet, an electronic tag reader positioned and configured to read the filter information from the electronic tag and a pump controller. The pump controller can be coupled to the electronic tag reader and configured to receive filter information from the electronic tag reader, communicate the filter information over a communications link and control operation of the pump to dispense a fluid. The pump management system can be configured to receive the filter information from the pump, access a library of operating routines based on the filter information and a process fluid information to select an operating routine for the pump. The pump management system can communicate the selected operating routine to the pump controller. The operating routines can include priming routines that include a back pressure and back flush segments.

BRIEF DESCRIPTION OF THE DRAWING

A more complete understanding of the embodiments and the advantages thereof may be acquired by referring to the following description, taken in conjunction with the accompanying drawings in which like reference numbers indicate like features and wherein:

FIGS. 3 and 4A-4G are diagrammatic representations of valve and motor timings for various embodiments of dispense cycles;

DETAILED DESCRIPTION

The disclosure and the various features and advantageous details thereof are explained more fully with reference to the non-limiting embodiments that are illustrated in the accompanying drawings and detailed in the following description. Descriptions of well known starting materials, processing techniques, components and equipment are omitted so as not to unnecessarily obscure the disclosure in detail. Skilled artisans should understand, however, that the detailed description and the specific examples, while disclosing preferred embodiments, are given by way of illustration only and not by way of limitation. Various substitutions, modifications, additions or rearrangements within the scope of the underlying inventive concept(s) will become apparent to those skilled in the art after reading this disclosure.

Figure 1:
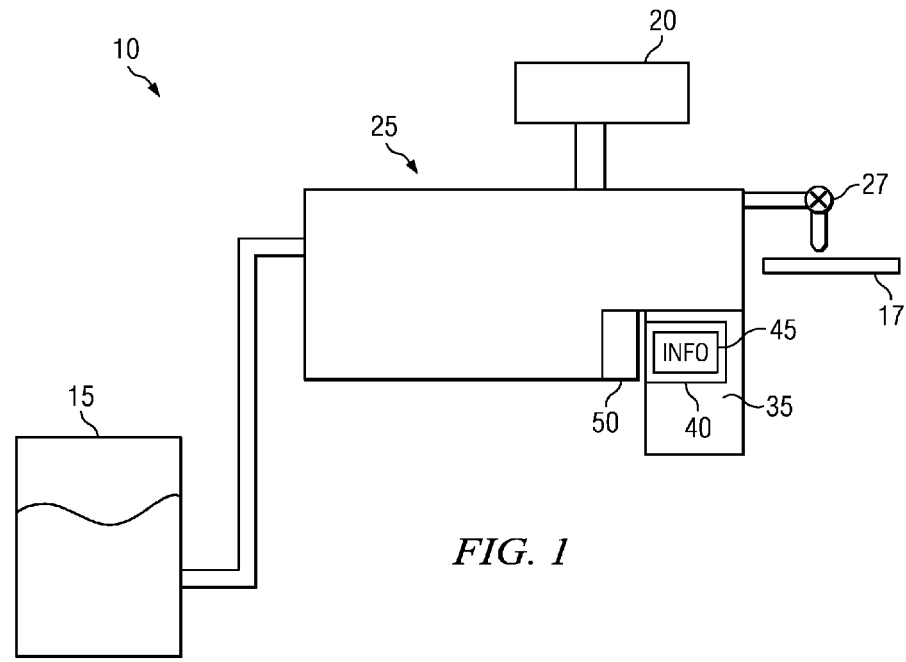
FIG. 1 is a diagrammatic representation of one embodiment of a portion of a semiconductor manufacturing system.

FIG. 1 is a diagrammatic representation of one embodiment of a portion of a semiconductor manufacturing system 10 for dispensing fluid from a fluid reservoir 15 onto a wafer 17. System 10 can also include a pump controller 20 and pump 25. Pump controller 20 can be onboard pump 25 or connected to pump 25 via a one or more communications links for communicating control signals, data or other information. Pump controller 20 controls pump 25 to dispense fluid onto wafer 17. System 10 can also include external valves such as a stop/suckback valve 27 that can prevent dripping at the dispense nozzle.

Pump 25 may include a removable filter 35 that has electronically readable filter information tag 40 containing filter information 45. Filter information 45 can include any information about filter 35 and other information that can be stored in an electronically readable tag. A tag reader 50 is provided to read filter information 45 from filter information tag 40 and provide the information to pump controller 20, a system management computer or other computer.

In one embodiment, filter information tag 40 can be an active or passive RFID tag and tag reader 50 can be an RFID tag reader. In other embodiments, filter information tag 40 can be a bar code or other optically readable code and tag reader 50 can be a bar code scanner or other scanner capable of reading tag 40.

Examples of filter information 45 include, but are not limited to, part number, design style, membrane type, retention rating, generation of the filter, configuration of the filter membrane, lot number, serial number, a device flow, membrane thickness, membrane bubble point, particle quality, filter manufacturer quality information or other information. The design style indicates the type of pump for which the filter is designed, the capacity/size of the filter, amount of membrane material in the filter or other information about the design of the filter. The membrane type indicates the material and/or thickness of the membrane. The retention rating indicates the size of particles that can be removed with a particular efficiency by the membrane. The generation of the filter indicates whether the filter is a first, second, third or other generation of the filter design. The configuration of the filter membrane indicates whether the filter is pleated, the type of pleating or other information regarding the design of the membrane. The serial number provides the serial number of the individual filter. The lot number can specify the manufacturing lot of the filter or membrane. The device flow indicates the flow rate the filter can handle while still producing good dispenses. The device flow can be determined during manufacture for the individual filter. The membrane bubble point provides another measure of the flow rates/pressure the filter can handle and still produce good dispenses. The membrane bubble point can also be determined during manufacture for the individual filter. The above examples are provided by way of explanation are not limiting of the information that can be contained in filter information 45.

Filter information 45 can include a part number that conveys a variety of information. For example, each letter in the example part number format "Aabcdefgh" can convey a different piece of information. Table 1 below provides an example of information conveyed by the part number:

TABLE 1

| Letter | Information | Examples |
|---|---|---|
| A | Connectology | |
| a | Design Style—Indicates the type of pump for which the filter is designed. | For IntelliGen Pump Filters: P = wide body pump (IntelliGen1 or IntelliGen2) 2 or M = IntelliGen3 or IntelliGen Mini Pump |
| b | Membrane Type—Type of Membrane Used in Filter | A = thin UPE U = thick UPE S = asymmetric nylon and UPE or other combination) M = PCM (chemically modified UPE) N = nylon |

TABLE 1-continued

| Letter | Information | Examples |
|---|---|---|
| c | Retention Rating | G = 0.2 um |
| | | V = 0.1 um |
| | | Z = 0.05 um |
| | | Y = 30 nm |
| | | X = 20 nm |
| | | T = 10 nm |
| | | F = 5 nm |
| | | K = 3 nm |
| d | Generation—generation of filter | 0 = V1 |
| | | 2 = V2 |
| e | RFID | R = RFID |
| f | Pleat—Type of Pleating Used in Filter | 0 = Standard |
| | | M = M pleat |
| g | Where O-Ring is Located | 0 = OM |
| | | K = Karlez |
| | | E = EPDM |
| | | R = O-ringless |
| h | How Many Filters in a Box | 1 = 1 per box |
| | | 3 = 3 per box |

Using the example of Table 1, the part number A2AT2RMR1 for an Impact pump filter would indicate that the connectology of the filter, the filter is designed for an IntelliGen Pump (Impact and IntelliGen are trademarks of Entegris, Inc. of Billerica, Mass.), the membrane is thin UPE, has a retention rating of 10 nm, the filter is a version 2 filter, the filter includes an RFID tag, the filter membrane has an M-pleat, the filter is O-ringless and there is one filter per box. The use of a part number to convey information is provided by way of example and filter information can be conveyed in other manners.

In operation, filter 35 can be coupled to pump 25. Tag reader 50 reads filter information 45 from tag 40 and communicates the filter information 45 to pump controller 20. Pump controller 20 processes filter information 45 or passes the filter information 45 on to a pump management system (discussed below). Pump controller 20 can apply rules to filter information 45 to determine whether and how to operate pump 25. Additionally, pump controller 20 can adjust the operation of pump 25 during a dispense cycle based on filter information 45.

Pump controller 20 (or other system) can also use filter information 45 to correlate good or bad operations to filter characteristics. During operation, pump controller 20 can track a variety of operational data for pump 25. The information tracked by pump controller 20 can include any operational parameters made available to controller 20 and any information calculated by pump controller 20. Some nonlimiting examples of operational data include pressure, parameters related to valve operation, motor positions, motor speeds, hydraulic pressure or other parameters (such as temperature if the pump includes temperature sensors). This information can be used to determine whether the dispense is/was a good dispense. This can be done after a dispense has occurred or in real time during the dispense cycle.

The operational data can be correlated to the filter information 45 so that the effect of the various filter parameters on dispense quality can be identified. As an example, pump controller 20 can record the lot number of a filter so that operational data of pump 25 can be correlated to that lot. This information can be used to identify whether a particular lot of filters produced better or worse results compared to another lot of filters of the same design. Similarly, the serial number can be used to track operational data versus an individual filter to help determine if the individual filter was the cause of bad coatings. As yet another example, operational data can be correlated to membrane bubble points to determine if filters having the same part number but different membrane bubble points had different dispense results. Recording information from tag 40 and tracking information about dispenses can help optimize selection and even manufacture of filters.

Figure 2:
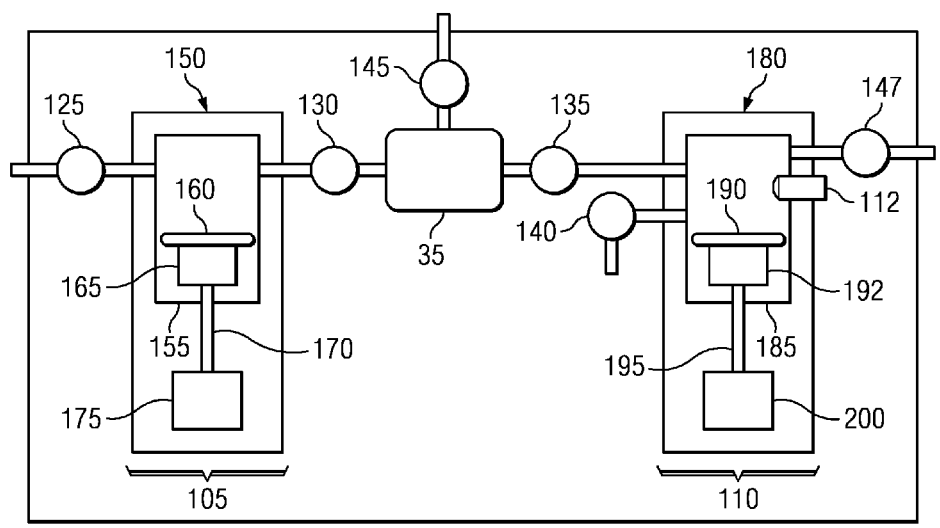
FIG. 2 is a diagrammatic representation of a multiple stage pump ("multi-stage pump") according to one embodiment.

Pump 25 can be any suitable pump including a single stage pump or multiple stage ("multi-stage") pump. Example multi-stage pumps include, but are not limited to the Entegris Intelligen Mini Dispense System, the Entegris Intelligen HV dispense system and other multi-stage pumps. FIG. 2 is a diagrammatic representation of one embodiment of a multi-stage pump 25. Multi-stage pump 25 includes a feed stage portion 105 and a separate dispense stage portion 110. Located between feed stage portion 105 and dispense stage portion 110, from a fluid flow perspective, is filter 35 to filter impurities from the process fluid. A number of valves can control fluid flow through multi-stage pump 25 including, for example, inlet valve 125, isolation valve 130, barrier valve 135, purge valve 140, vent valve 145 and outlet valve 147. Dispense stage portion 110 can further include a pressure sensor 112 that determines the pressure of fluid at dispense stage 110. The pressure determined by pressure sensor 112 can be used to control the speed of the various pumps as described below. Example pressure sensors include ceramic and polymer piezoresistive and capacitive pressure sensors, including those manufactured by Metallux AG, of Korb, Germany. According to one embodiment, the face of pressure sensor 112 that contacts the process fluid is a perfluoropolymer. Pump 25 can include additional pressure sensors, such as a pressure sensor to read pressure in feed chamber 155, temperature sensors and other sensors.

Feed stage 105 and dispense stage 110 can include rolling diaphragms to pump fluid in multi-stage pump 25. Feed-stage pump 150 ("feed pump 150"), for example, includes a feed chamber 155 to collect fluid, a feed stage diaphragm 160 to move within feed chamber 155 and displace fluid, a piston 165 to move feed stage diaphragm 160, a lead screw 170 and a stepper motor 175. Lead screw 170 couples to stepper motor 175 through a nut, gear or other mechanism for imparting energy from the motor to lead screw 170. According to one embodiment, feed motor 175 rotates a nut that, in turn, rotates lead screw 170, causing piston 165 to actuate. Dispense-stage pump 180 ("dispense pump 180") can similarly include a dispense chamber 185, a dispense stage diaphragm 190, a piston 192, a lead screw 195, and a dispense motor 200. Dispense motor 200 can drive lead screw 195 through a threaded nut (e.g., a Torlon or other material nut).

In other embodiments, feed stage 105 and dispense stage 110 can include other types of pumps including pneumatically or hydraulically actuated pumps, hydraulic pumps or other pumps. One example of a multi-stage pump using a pneumatically actuated pump for the feed stage and a stepper motor driven hydraulic pump is described in U.S. patent application Ser. No. 11/051,576 entitled "PUMP CONTROLLER FOR PRECISION PUMPING APPARATUS" by inventors Zagars et al., filed Feb. 4, 2005 now issued as U.S. Pat. No. 7,476,087 on Jan. 13, 2009, which is hereby fully incorporated by reference herein. The use of motors at both stages, however, provides an advantage in that the hydraulic piping, control systems and fluids are eliminated, thereby reducing space and potential leaks. Examples of multi-stage pumps using motors in both the feed stage and dispense stage are provided in U.S. patent application Ser. No. 11/602,464 entitled "SYSTEM AND METHOD FOR A PUMP WITH REDUCED FORM FACTOR" by inventors Cedrone et al, filed Nov. 20, 2006 now issued as U.S. Pat. No. 8,087,429 on Jan. 3, 2012; and U.S. patent application Ser. No. 12/218,325 entitled "METHOD AND SYSTEM FOR HIGH VISCOSITY PUMP" by inventors Cedrone et al, filed Jul. 14, 2008 now issued as U.S. Pat. No. 8,753,097 on Jun. 17, 2014; which are hereby fully incorporated by reference herein.

Feed motor 175 and dispense motor 200 can be any suitable motor. According to one embodiment, dispense motor 200 is a Permanent-Magnet Synchronous Motor ("PMSM"). The PMSM can be controlled by a digital signal processor ("DSP") utilizing Field-Oriented Control ("FOC") or other type of position/speed control known in the art at motor 200, a controller onboard multi-stage pump 25 or a separate pump controller (e.g. as shown in FIG. 1). PMSM 200 can further include an encoder (e.g., a fine line rotary position encoder) for real time feedback of dispense motor 200's position. The use of a position sensor gives accurate and repeatable control of the position of piston 192, which leads to accurate and repeatable control over fluid movements in dispense chamber 185. For, example, using a 2000 line encoder, which according to one embodiment gives 8000 pulses to the DSP, it is possible to accurately measure to and control at 0.045 degrees of rotation. In addition, a PMSM can run at low velocities with little or no vibration. Feed motor 175 can also be a PMSM or a stepper motor. It should also be noted that the feed pump can include a home sensor to indicate when the feed pump is in its home position.

During operation of multi-stage pump 25, the valves of multi-stage pump 25 are opened or closed to allow or restrict fluid flow to various portions of multi-stage pump 25. According to one embodiment, these valves can be pneumatically actuated (i.e., gas driven) diaphragm valves that open or close depending on whether pressure or a vacuum is asserted. All or some of the valves can also be other types of valves.

Multi-stage pump 25 can be controlled according to a variety of control schemes including, but not limited to those described in U.S. Provisional Patent Application No. 60/741,682 entitled "SYSTEM AND METHOD FOR PRESSURE COMPENSATION IN A PUMP" by Inventors Cedrone et al., filed Dec. 2, 2005; U.S. patent application Ser. No. 11/502,729 entitled "SYSTEMS AND METHODS FOR FLUID FLOW CONTROL IN AN IMMERSION LITHOGRAPHY SYSTEM" by Inventors Clarke et al., filed Aug. 11, 2006, now issued as U.S. Pat. No. 7,443,483 on Oct. 28, 2008; U.S. patent application Ser. No. 11/602,472, entitled "SYSTEM AND METHOD FOR CORRECTING FOR PRESSURE VARIATIONS USING A MOTOR" by Inventors Cedrone et al., filed Nov. 20, 2006 now issued as U.S. Pat. No. 8,172,546 on May 8, 2012; U.S. patent application Ser. No. 11/292,559 entitled "SYSTEM AND METHOD FOR CONTROL OF FLUID PRESSURE" by Inventors Gonnella et al., filed Dec. 2, 2005; U.S. patent application Ser. No. 11/364,286 entitled "SYSTEM AND METHOD FOR MONITORING OPERATION OF A PUMP" by Inventors Gonnella et al., filed Feb. 28, 2006 now issued as U.S. Pat. No. 7,850,431 on Dec. 14, 2010; U.S. patent application Ser. No. 11/602,508, entitled "SYSTEM AND METHOD FOR PRESSURE COMPENSATION IN A PUMP" by Inventors Cedrone et al., filed Nov. 20, 2006 now issued as U.S. Pat. No. 8,029,247 on Oct. 4, 2011; and U.S. patent application Ser. No. 11/602,449, entitled "I/O SYSTEMS, METHODS AND DEVICES FOR INTERFACING A PUMP CONTROLLER" by Inventors Cedrone et al., filed Nov. 20, 2006 now issued as U.S. Pat. No. 7,940,664 on May 10, 2011, each of which is fully incorporated by reference herein.

According to one embodiment, multi-stage pump 25 can include a ready segment, dispense segment, fill segment, pre-filtration segment, filtration segment, vent segment, purge segment and static purge segment. During the feed segment, inlet valve 125 is opened and feed stage pump 150 moves (e.g., pulls) feed stage diaphragm 160 to draw fluid into feed chamber 155. Once a sufficient amount of fluid has filled feed chamber 155, inlet valve 125 is closed. During the filtration segment, feed-stage pump 150 moves feed stage diaphragm 160 to displace fluid from feed chamber 155. Isolation valve 130 and barrier valve 135 are opened to allow fluid to flow through filter 35 to dispense chamber 185. Isolation valve 130, according to one embodiment, can be opened first (e.g., in the "pre-filtration segment") to allow pressure to build in filter 35 and then barrier valve 135 opened to allow fluid flow into dispense chamber 185. According to other embodiments, both isolation valve 130 and barrier valve 135 can be opened and the feed pump moved to build pressure on the dispense side of the filter.

During the filtration segment, dispense pump 180 can be brought to its home position. As described in U.S. Provisional Patent Application No. 60/630,384, entitled "SYSTEM AND METHOD FOR A VARIABLE HOME POSITION DISPENSE SYSTEM" by Layerdiere, et al. filed Nov. 23, 2004; U.S. patent application Ser. No. 11/666,124, entitled "SYSTEM AND METHOD FOR A VARIABLE HOME POSITION DISPENSE SYSTEM" by Layerdiere, et al., filed Sep. 30, 2008 now issued as U.S. Pat. No. 8,292,598 on Oct. 29, 2012; and PCT Application No. PCT/US2005/042127, entitled "SYSTEM AND METHOD FOR VARIABLE HOME POSITION DISPENSE SYSTEM", by Applicant Entegris, Inc. and Inventors Layerdiere et al., filed Nov. 21, 2005, published as International Publication No. WO2006/057957 A2 on Jan. 6, 2006; all of which are hereby incorporated by reference, the home position of the dispense pump can be a position that gives the greatest available volume at the dispense pump for the dispense cycle, but is less than the maximum available volume that the dispense pump could provide. The home position is selected based on various parameters for the dispense cycle to reduce unused hold up volume of multi-stage pump 25. Feed pump 150 can similarly be brought to a home position that provides a volume that is less than its maximum available volume.

At the beginning of the vent segment, isolation valve 130 is opened, barrier valve 135 closed and vent valve 145 opened. In another embodiment, barrier valve 135 can remain open during the vent segment and close at the end of the vent segment. During this time, if barrier valve 135 is open, the pressure can be understood by the controller because the pressure in the dispense chamber, which can be measured by pressure sensor 112, will be affected by the pressure in filter 35. Feed-stage pump 150 applies pressure to the fluid to remove air bubbles from filter 35 through open vent valve 145. Feed-stage pump 150 can be controlled to cause venting to occur at a predefined rate, allowing for longer vent times and lower vent rates, thereby allowing for accurate control of the amount of vent waste. If feed pump is a pneumatic style pump, a fluid flow restriction can be placed in the vent fluid path, and the pneumatic pressure applied to feed pump can be increased or decreased in order to maintain a "venting" set point pressure, giving some control of an otherwise un-controlled method.

At the beginning of the purge segment, isolation valve 130 is closed, barrier valve 135, if it is open in the vent segment, is closed, vent valve 145 closed, purge valve 140 opened and inlet valve 125 opened. Dispense pump 180 applies pressure to the fluid in dispense chamber 185 to vent air bubbles through purge valve 140. During the static purge segment, dispense pump 180 is stopped, but purge valve 140 remains open to continue to vent air. Any excess fluid removed during the purge or static purge segments can be routed out of multi-stage pump 25 (e.g., returned to the fluid source or discarded) or recycled to feed-stage pump 150. During the ready segment, inlet valve 125, isolation valve 130 and barrier valve 135 can be opened and purge valve 140 closed so that feed-stage pump 150 can reach ambient pressure of the source (e.g., the source bottle). According to other embodiments, all the valves can be closed at the ready segment.

During the dispense segment, outlet valve 147 opens and dispense pump 180 applies pressure to the fluid in dispense chamber 185. Because outlet valve 147 may react to controls more slowly than dispense pump 180, outlet valve 147 can be opened first and some predetermined period of time later dispense motor 200 started. This prevents dispense pump 180 from pushing fluid through a partially opened outlet valve 147. Moreover, this prevents fluid moving up the dispense nozzle caused by the valve opening, followed by forward fluid motion caused by motor action. In other embodiments, outlet valve 147 can be opened and dispense begun by dispense pump 180 simultaneously.

An additional suckback segment can be performed in which excess fluid in the dispense nozzle is removed. During the suckback segment, outlet valve 147 can close and a secondary motor or vacuum can be used to suck excess fluid out of the outlet nozzle. Alternatively, outlet valve 147 can remain open and dispense motor 200 can be reversed to such fluid back into the dispense chamber. The suckback segment helps prevent dripping of excess fluid onto the wafer.

Figure 3:
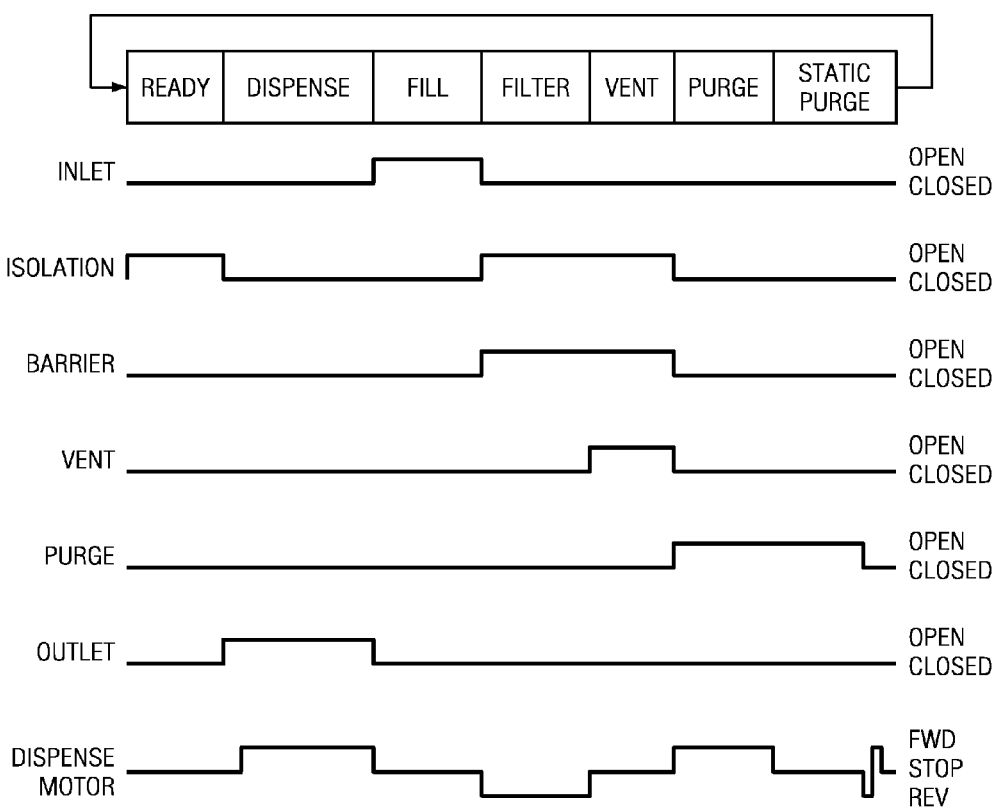
Figure 4B:
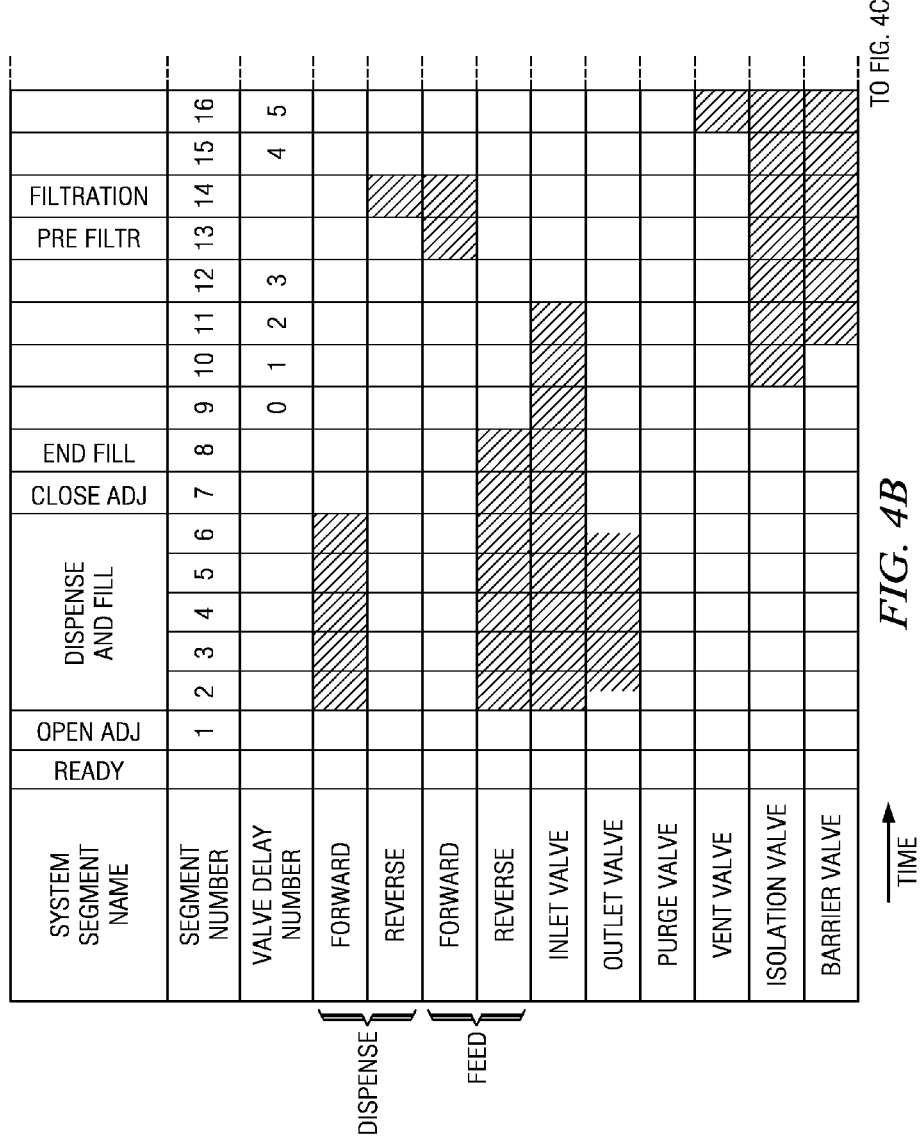
Figure 4C:
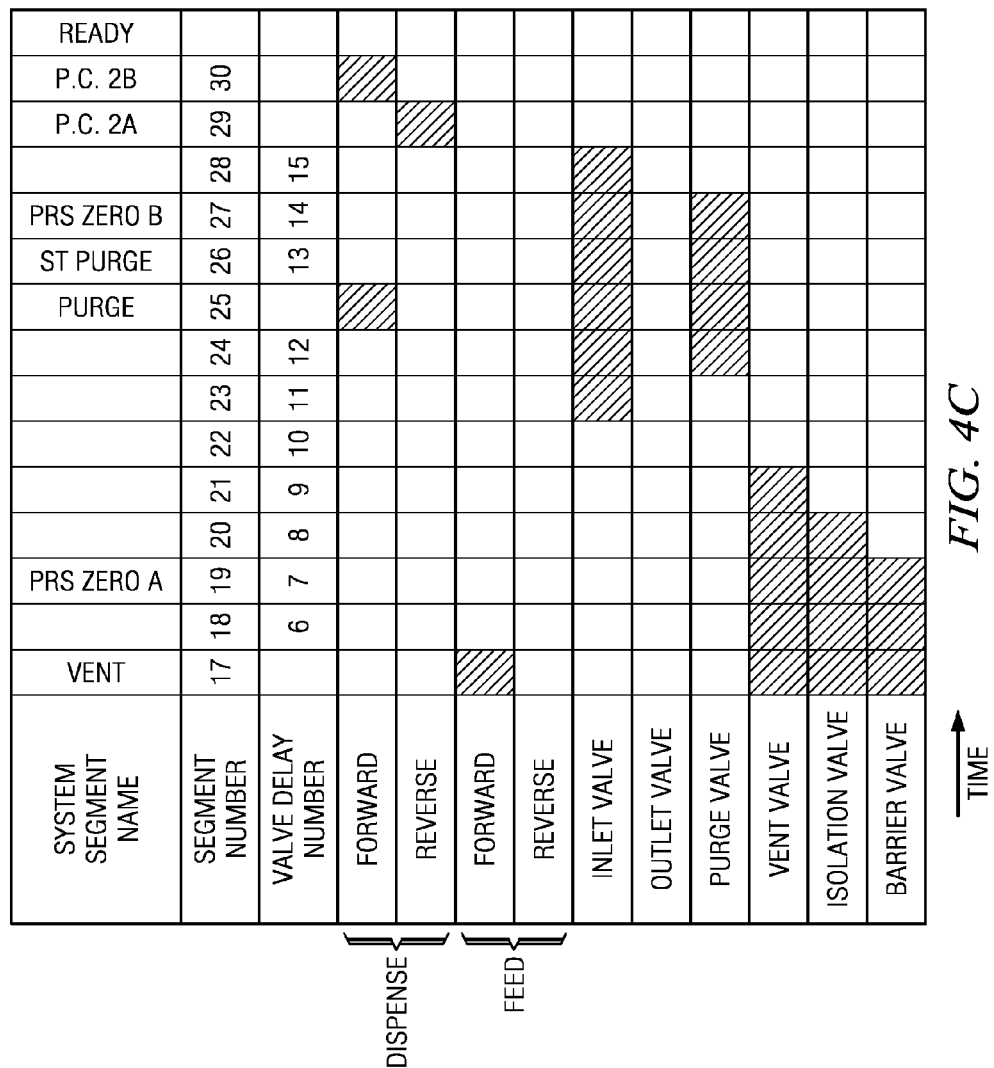
Figure 4D:
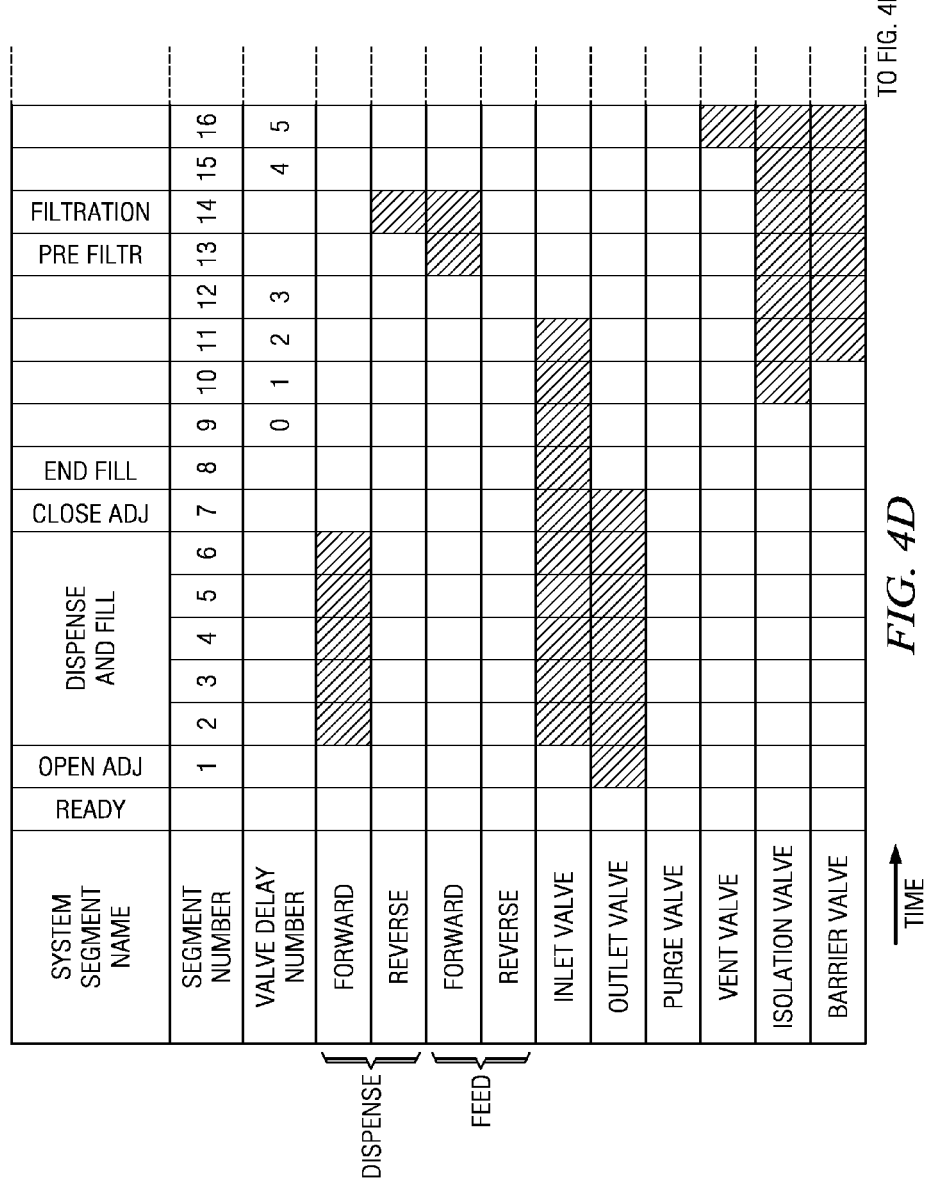
Figure 4E:
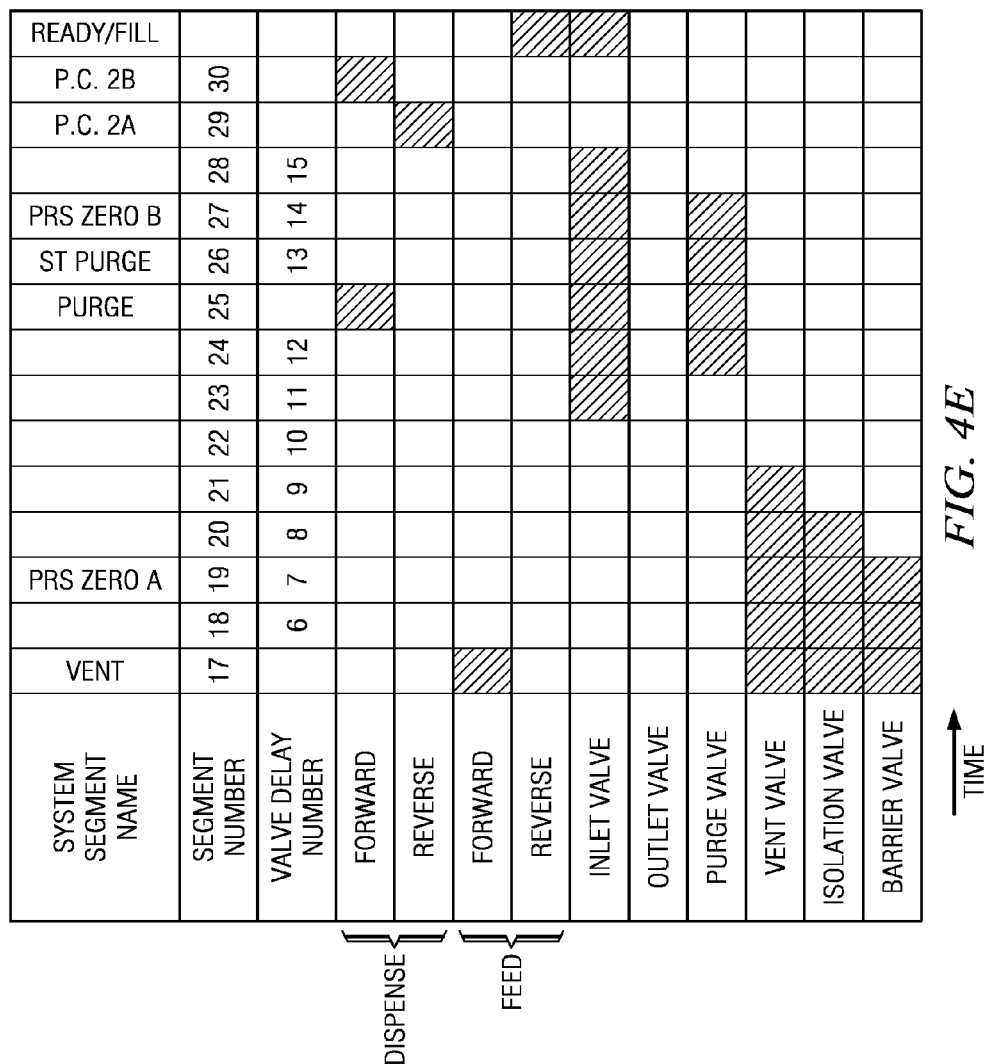
Figure 4F:
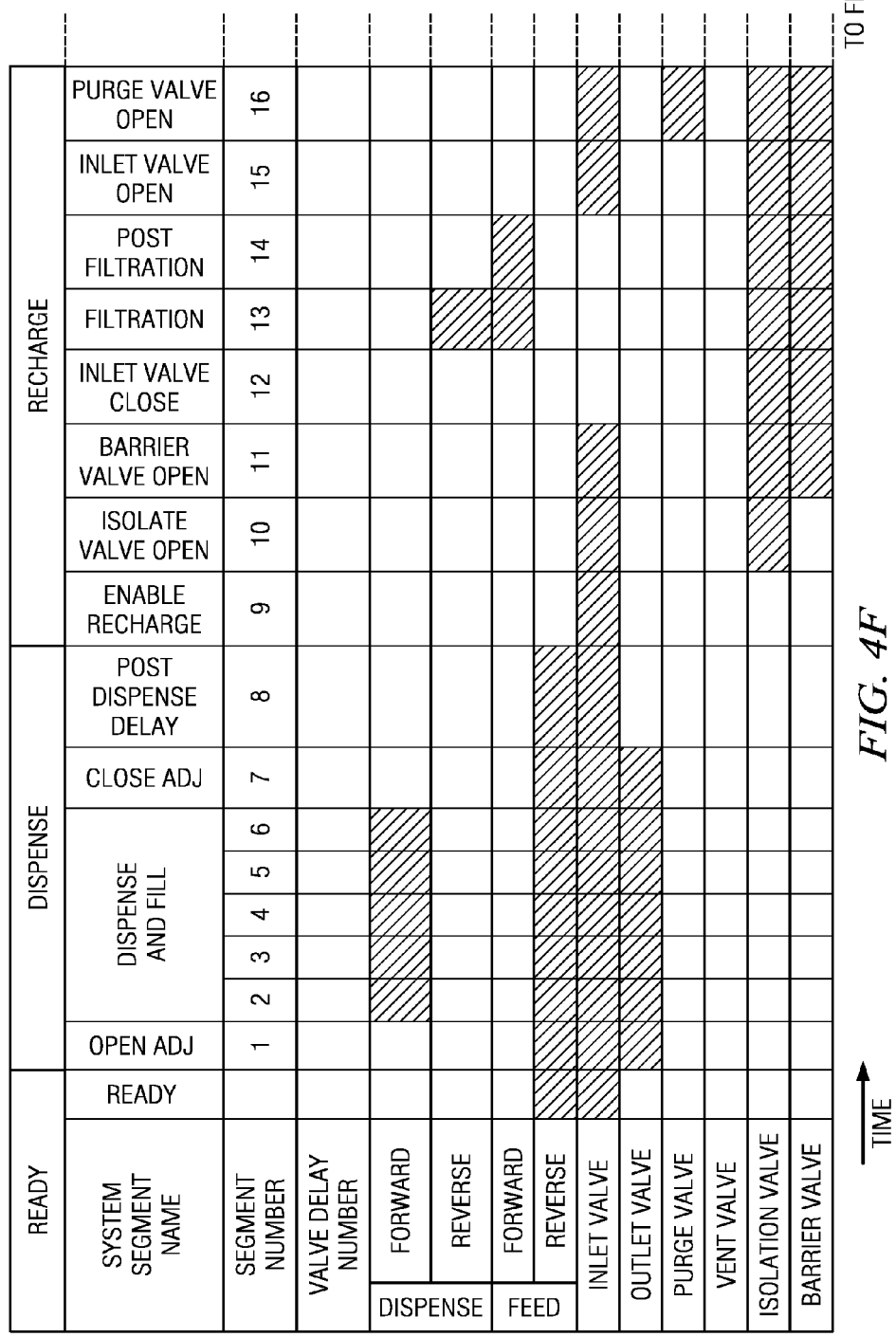

Referring briefly to FIG. 3, this figure provides a diagrammatic representation of valve and dispense motor timings for various segments of the operation of multi-stage pump 25 of FIG. 2. Other sequences are shown in FIGS. 4A-G. While several valves are shown as closing simultaneously during segment changes, the closing of valves can be timed slightly apart (e.g., 100 milliseconds) to reduce pressure spikes. For example, between the vent and purge segment, isolation valve 130 can be closed shortly before vent valve 145. It should be noted, however, other valve timings can be utilized in various embodiments. Additionally, several of the segments can be performed together (e.g., the fill/dispense stages can be performed at the same time, in which case both the inlet and outlet valves can be open in the dispense/fill segment). It should be further noted that specific segments do not have to be repeated for each cycle. For example, the purge and static purge segments may not be performed every cycle. Similarly, the vent segment may not be performed every cycle. Moreover, various segments can be put together in specific cycles (e.g., a vent cycle that involves multiple segments) and the cycles put together into a larger cycle.

The opening and closing of various valves can cause pressure spikes in the fluid within multi-stage pump 25. Because outlet valve 147 is closed during the static purge segment, closing of purge valve 140 at the end of the static purge segment, for example, can cause a pressure increase in dispense chamber 185. This can occur because each valve may displace a small volume of fluid when it closes. More particularly, in many cases before a fluid is dispensed from chamber 185 a purge cycle and/or a static purge cycle is used to purge air from dispense chamber 185 in order to prevent sputtering or other perturbations in the dispense of the fluid from multi-stage pump 25. At the end of the static purge cycle, however, purge valve 140 closes in order to seal dispense chamber 185 in preparation for the start of the dispense. As purge valve 140 closes it forces a volume of extra fluid (approximately equal to the hold-up volume of purge valve 140) into dispense chamber 185, which, in turn, causes an increase in pressure of the fluid in dispense chamber 185 above the baseline pressure intended for the dispense of the fluid. This excess pressure (above the baseline) may cause problems with a subsequent dispense of fluid. These problems are exacerbated in low pressure applications, as the pressure increase caused by the closing of purge valve 140 may be a greater percentage of the baseline pressure desirable for dispense.

More specifically, because of the pressure increase that occurs due to the closing of purge valve 140 a "spitting" of fluid onto the wafer, a double dispense or other undesirable fluid dynamics may occur during the subsequent dispense segment if the pressure is not reduced. Additionally, as this pressure increase may not be constant during operation of multi-stage pump 25, these pressure increases may cause variations in the amount of fluid dispensed, or other characteristics of the dispense, during successive dispense segments. These variations in the dispense may in turn cause an increase in wafer scrap and rework of wafers. Various embodiments account for the pressure increase due to various valve closings within the system to achieve a desirable starting pressure for the beginning of the dispense segment, account for differing head pressures and other differences in equipment from system to system by allowing almost any baseline pressure to be achieved in dispense chamber 185 before a dispense.

In one embodiment, to account for unwanted pressure increases to the fluid in dispense chamber 185, during the static purge segment dispense motor 200 may be reversed to back out piston 192 a predetermined distance to compensate for any pressure increase caused by the closure of barrier valve 135, purge valve 140 and/or any other sources which may cause a pressure increase in dispense chamber 185.

Thus, embodiments described herein provide a multi-stage pump with gentle fluid handling characteristics. By compensating for pressure fluctuations in a dispense chamber before a dispense segment, potentially damaging pressure spikes can be avoided or mitigated. Embodiments of a multi-stage pump can also employ other pump control mechanisms and valve timings to help reduce deleterious effects of pressure on a process fluid.

Figure 5:
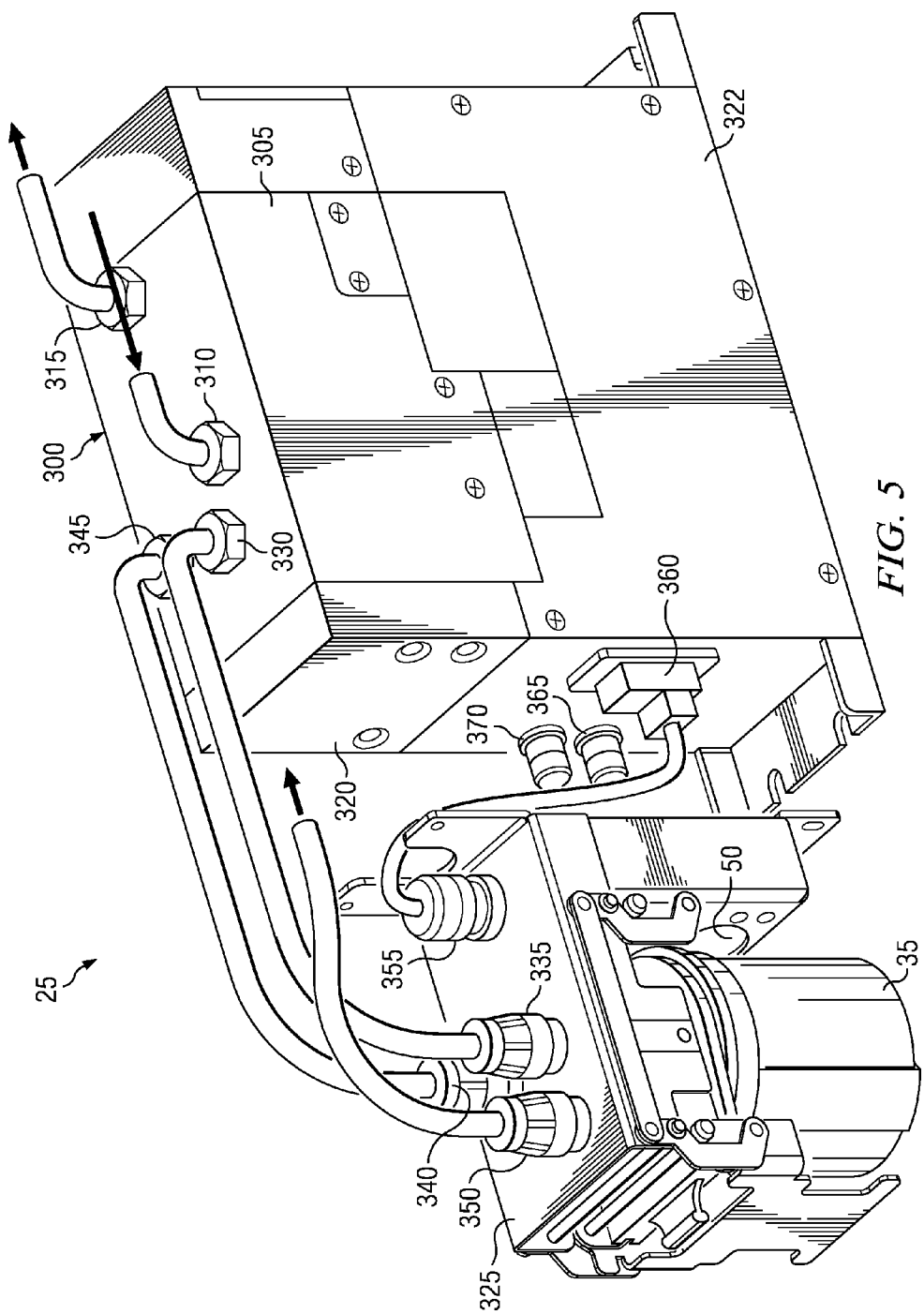
FIG. 5 is a diagrammatic representation showing a view of one embodiment of a pump.

FIG. 5 is a diagrammatic representation of one embodiment of pump 25 having a pump main body 300 and a manifold 325. Pump 25 can include a dispense block 305 that at least partially defines the fill chamber, dispense chamber and portions of flow passages described above in conjunction with FIG. 2. Dispense block 305, according to one embodiment, can be a unitary block of PTFE, modified PTFE or other material. Because these materials do not react with or are minimally reactive with many process fluids, the use of these materials allows flow passages and pump chambers to be machined directly into dispense block 305 with a minimum of additional hardware.

Dispense block 305 can include various external inlets and outlets including, for example, inlet 310 through which the fluid is received and dispense outlet 315 through which fluid is dispensed during the dispense segment. Dispense block 305, in the example of FIG. 5, does not include an external purge outlet as purged fluid can be routed back to the feed chamber. In other embodiments, however, fluid can be purged externally.

Figure 8:
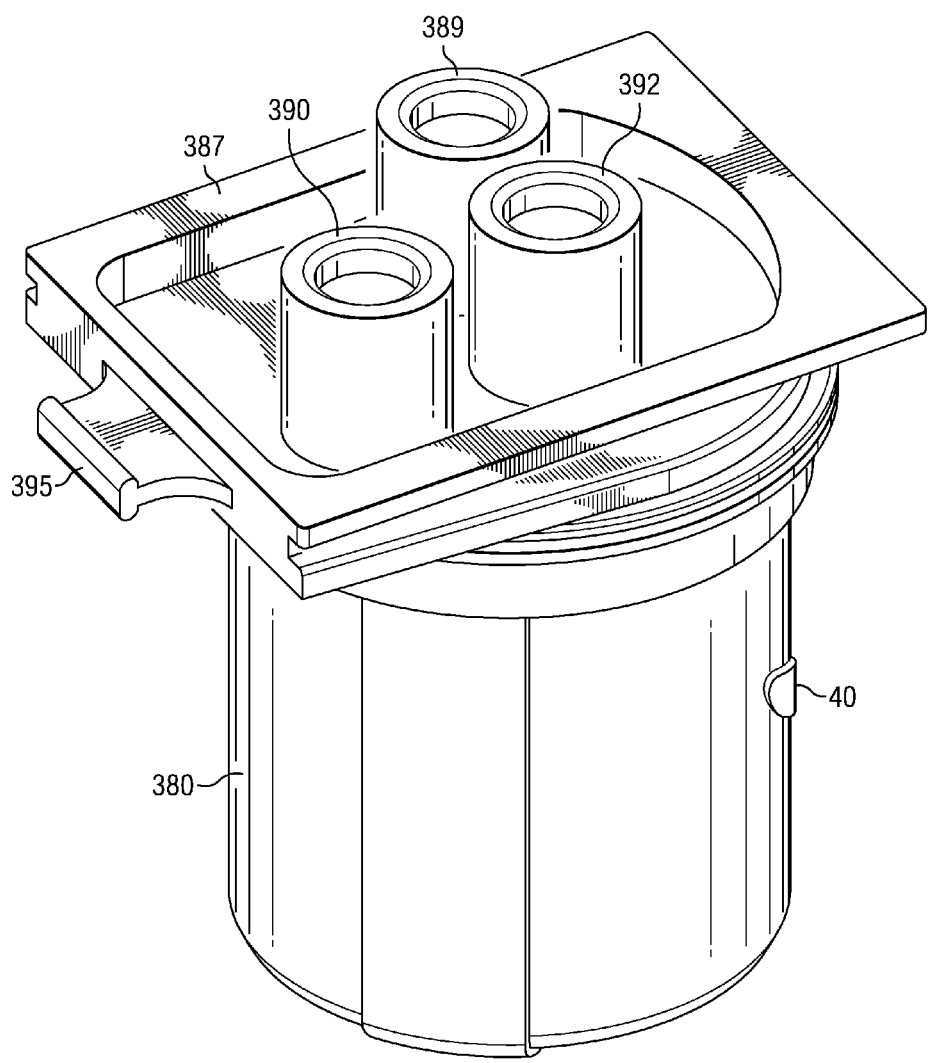
FIG. 8 is a diagrammatic representation of one embodiment of a filter.

A valve plate 320 can work in cooperation with dispense block 305 to form some or all of the valves of pump 25. One embodiment of a valve plate is illustrated in FIG. 8 below. In other embodiments, some or all of the valves can be external.

A cover 322 provides protection for various components of pump 25, including feed motor 175 and dispense motor 200. Cover 322 can also provide protection for pistons, pump controller 20, fluid lines, pneumatic lines and other components.

A manifold 325 provides a connection for filter 35. Filter 35 can connect to manifold 325 using any suitable mechanism, including, but not limited to the filter connections described in U.S. Provisional Patent Application No. 60/741,667, entitled "O-RING-LESS LOW PROFILE FITTING AND ASSEMBLY THEREOF" by Inventor Gashgaee, filed Dec. 2, 2005; and U.S. patent application Ser. No. 11/602,513, entitled "O-RING-LESS LOW PROFILE FITTINGS AND FITTING ASSEMBLIES" by inventor Gashgaee, filed Nov. 20, 2006 now issued as U.S. Pat. No. 7,547,049 on Jun. 16, 2009; which are hereby fully incorporated by reference herein. Flow passages in manifold 325 can connect internally or externally to flow passages in dispense block 305. Manifold 325 can include an integrated tag reader 50 that is positioned to read a filter information tag on the filter.

According to one embodiment, an outlet 330 from dispense block 305 can be in fluid communication with an inlet 335 on manifold 325 and an outlet 340 from manifold 325 can be in fluid communication with an inlet 345 on dispense block 305 to complete a flow path for filter 35 connected to manifold 325. In the embodiment of FIG. 5, manifold 325 can include a vent outlet 350 that can be in fluid communication with an external vent valve. Manifold 325 and the pump main body 300 can include connections 355 and 360 to allow integrated tag reader 50 to electrically connect to the pump controller.

Figure 6:
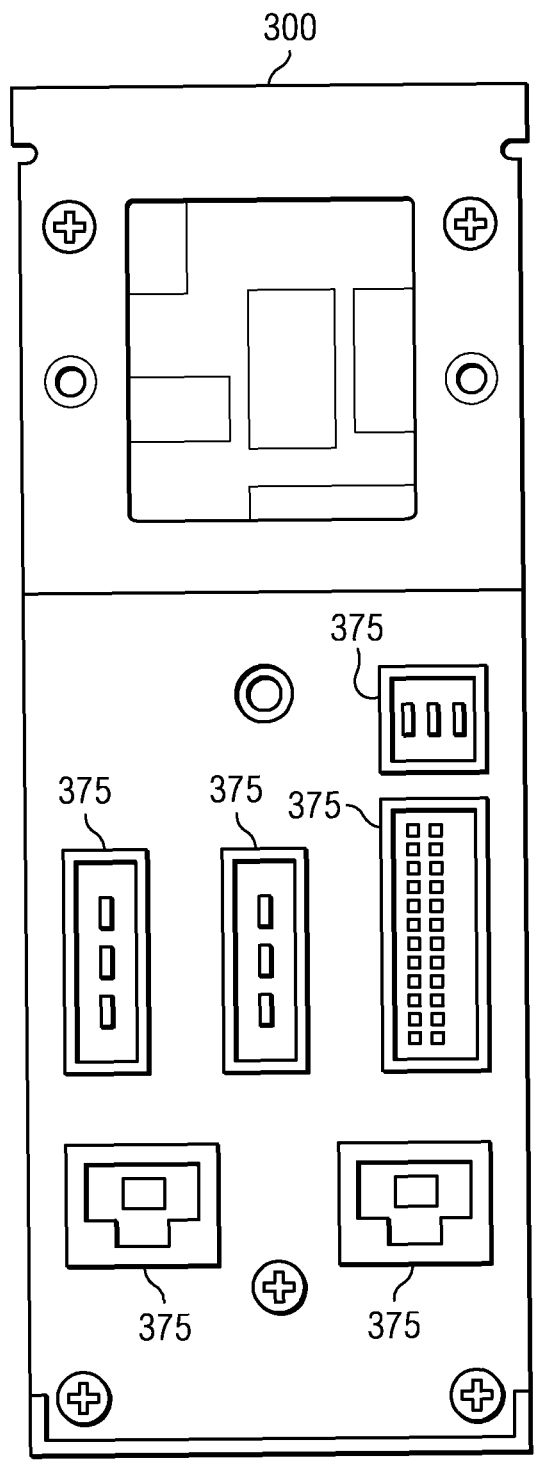
FIG. 6 is a diagrammatic representation showing another view of one embodiment of a pump.

Pump 25 can also include inlet 365 and outlet 370 that can connect to vacuum and pressure sources. According to one embodiment, selective application of vacuum or pressure can be used to open and close various valves defined by valve plate 320. FIG. 6 illustrates that pump 25 can include connections 375 for various communications links and power. Connections 375, according to one embodiment, can be configured so that pump 25 can hook into existing electrical tracks for pumps.

Figure 7:
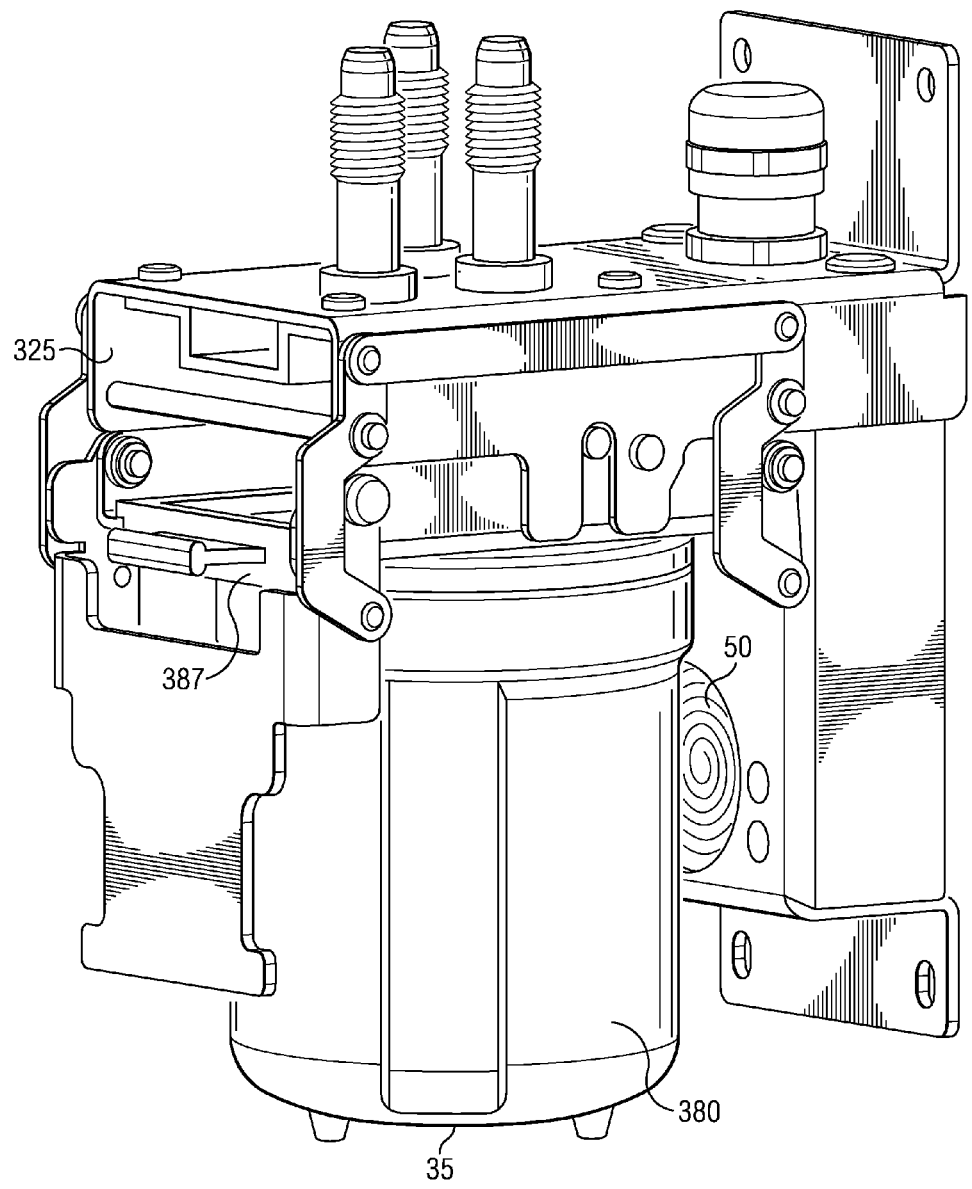
FIG. 7 is a diagrammatic representation of one embodiment of a filter and a manifold.

FIG. 7 is a diagrammatic representation of one embodiment of filter 35 connected to manifold 325. Manifold 325 can include a quick change mechanism for filters to allow filters to be easily connected to or removed from manifold 325. Any quick change mechanism or other mechanism known or developed in the art for connecting a filter 35 to manifold 325 or to otherwise connect filter 35 to the pump can be used. One embodiment of a connection mechanism for a filter is described in PCT Patent Application No. PCT/US2008/082289, filed Nov. 3, 2008, entitled "O-Ringless Seal Couplings", by Applicant Entegris, Inc. and inventors Towle et al., published as International Publication No. WO/2009/059324 on May 7, 2009 which claims priority to U.S. Provisional Application No. 60/985,103, which are hereby fully incorporated by reference herein. Another embodiment can include a separation module such as described in U.S. Pat. No. 7,163,237, entitled "Separation Module," to Niermeyer et al, issued Jan. 16, 2007, which is hereby fully incorporated by reference herein. According to one embodiment, filter 35 can include a bowl 380 and head 387. Bowl 380 can be shaped to accommodate a filter cartridge and head 387 can be shaped shaped to accommodate a quick change mechanism of manifold 325. Tag reader 50 is positioned to read a filter information tag attached to or embedded in filter 35.

FIG. 8 illustrates one embodiment of filter 35. Head 387 can include an outlet port 389, vent port 390 and inlet port 392 that are sized and shaped to complement ports on manifold 325. O-rings can be disposed in outlet port 389, vent port 390 and inlet port 392 to prevent leaks. Head 387 can be shaped and sized to allow insertion into a quick change out device of a pump. For ease of installation, head 387 can include a handle portion 395 that can include features to ease gripping by a robot or human.

According to one embodiment, filter 35 can include a filter information tag 40. For example, a RFID, Bluetooth, IR, other wireless protocol or other identification device can be placed on filter 35. The identification device can include manufacturer information about the filter (type of filter, retention rating, protocol for running the filter (by way of example, but not limitation, recipe variables, parameters, equations, curves for operations using the filter), priming/filling sequence for the filter pressure drop characteristics, flow rate, pore size or other information). While filter information tag 40 is illustrated as attached to the side of filter 35, filter information tag 40 can also be coupled to filter 35 in other manners. For example, filter information tag 40 can be press fit in a tag receiving portion of bowl 380 or head 387. In other embodiments, filter information tag 40 can be embedded in material that forms head 387 or bowl 387 or can be otherwise coupled to filter 35.

Figure 9:
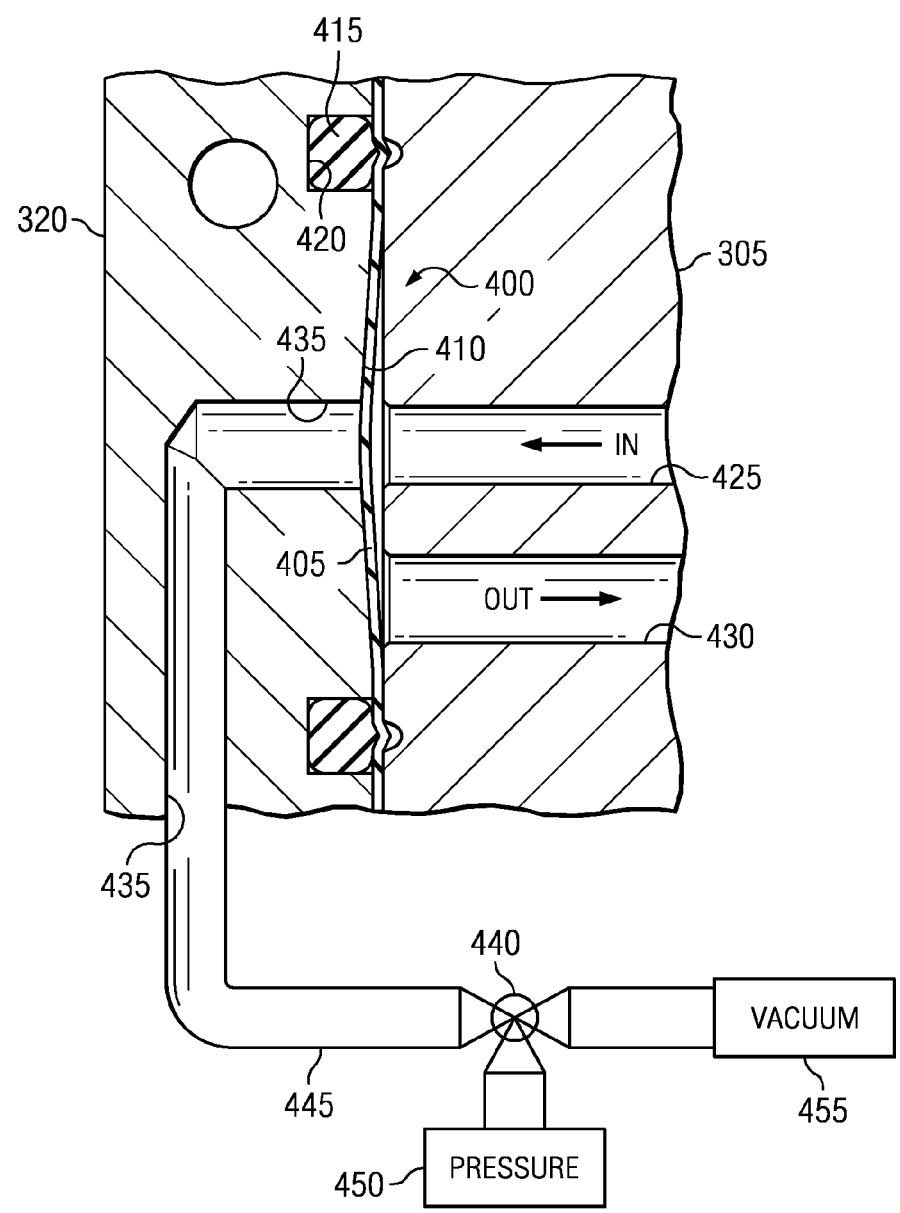
FIG. 9 is a diagrammatic representation of one embodiment of a valve assembly.

FIG. 9 is a diagrammatic representation of one embodiment of a valve assembly comprising dispense block 305 and valve plate 320 to form a valve 400. Valve plate 320 can provide a valve housing for a system of valves including one or more of inlet valve 125, isolation valve 130, barrier valve 135 and purge valve 140. According to one embodiment, each valve is at least partially integrated into valve plate 320 and is a diaphragm valve that is either opened or closed depending on whether pressure or vacuum is applied to the corresponding diaphragm. In other embodiments, some of the valves may be external to dispense block 305, arranged in additional valve plates or otherwise be provided.

According to one embodiment, a sheet of material 405 is sandwiched between valve plate 320 and dispense block 305 to form the diaphragms of the various valves. According to one embodiment material 305 can be a sheet of PTFE or other flexible material. Valve plate 320 forms a valve seat 410 into which material 405 can move. According to one embodiment, valve seat 410 has a shape to which material 405 can contour without leaving dead space. An O-ring 415 can be disposed in an annular groove 420 around the edge of each valve. O-ring 415 can be disposed on the valve plate side, dispense block side or O-rings can be disposed on both sides. Fluid can flow into and out of valve 400 through fluid flow passage 425 and 430. Flow passages 425 and 430 can be placed and sized as needed or desired.

According to one embodiment, valve plate 320 can be configured to reduce the hold-up volume of the valve, eliminate volume variations due to vacuum fluctuations, reduce vacuum requirements and reduce stress on the valve diaphragm. Example valve configurations are described in U.S. patent application Ser. No. 11/602,464 entitled "SYSTEM AND METHOD FOR A PUMP WITH REDUCED FORM FACTOR" by inventors Cedrone et al, filed Nov. 20, 2006 now issued as U.S. Pat. No. 8,087,429 on Jan. 3, 2012; and U.S. patent application Ser. No. 12/218,325 entitled "METHOD AND SYSTEM FOR HIGH VISCOSITY PUMP" by inventors Cedrone et al, filed Jul. 14, 2008 now issued as U.S. Pat. No. 8,753,097 on Jun. 17, 2014; which are hereby fully incorporated by reference herein Valve plate 320 can include a valve control inlet 435 for each valve to apply pressure or vacuum to the corresponding diaphragm or portion of a diaphragm. By the selective application of pressure or vacuum to the inlets, the corresponding valves are opened and closed so that fluid flow from inlet 425 to outlet 430 is restricted or allowed. According to one embodiment, the application of pressure or vacuum can be regulated by a solenoid valve 440 that either opens valve control supply line 445 to pressure from a pressure source 450 or vacuum from a vacuum source 455.

Figure 10:
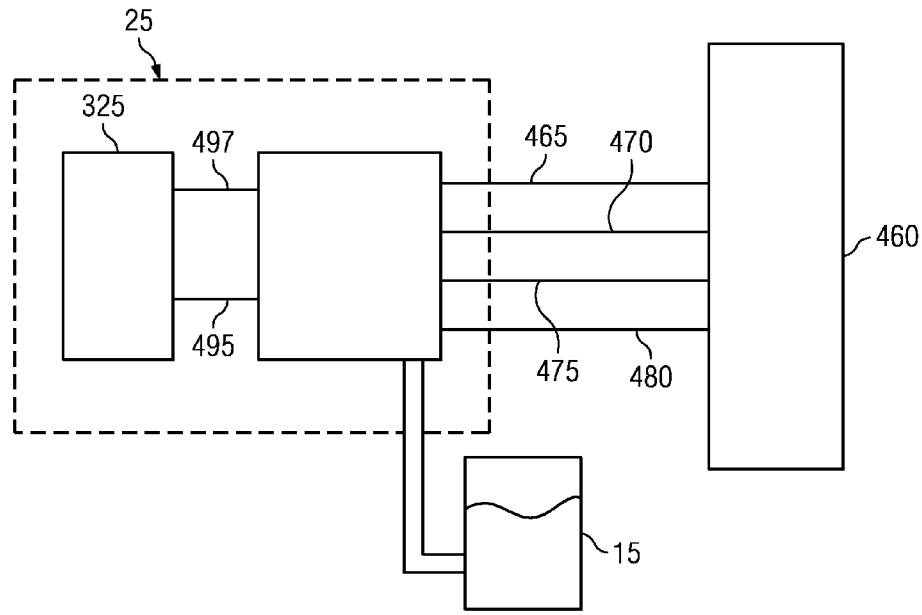
FIG. 10 is a diagrammatic representation of one embodiment of a pump and connections.

FIG. 10 is a diagrammatic representation of one embodiment of pump 25 and connections to other components. In the embodiment of FIG. 10, pump 25 includes an on-board pump controller that can be connected to pump track 460. Pump track 460 can allow multiple pumps to be set up in a compact space and can provide connections for I/O signals (represented at 465), serial communications (represented at 470) and electrical connections (represented at 475). Track 460 can also provide pneumatic connections for pressure/vacuum used to open and close valves (represented at 480).

The inlet of pump 25 can be connected to a fluid supply, such as resist bottle or other fluid supply 15. The output of pump 25 can be connected to a stop and suckback valve between the outlet of pump 25 and the wafer. Pump 25 can include internal or external fluid connections (represented at 495) between manifold 325 and other portions of pump 25. Additionally, pump 25 can include electrical connections (represented at 497) between the tag reader of manifold 325 and the pump controller or other electronics of pump 25.

Figure 11:
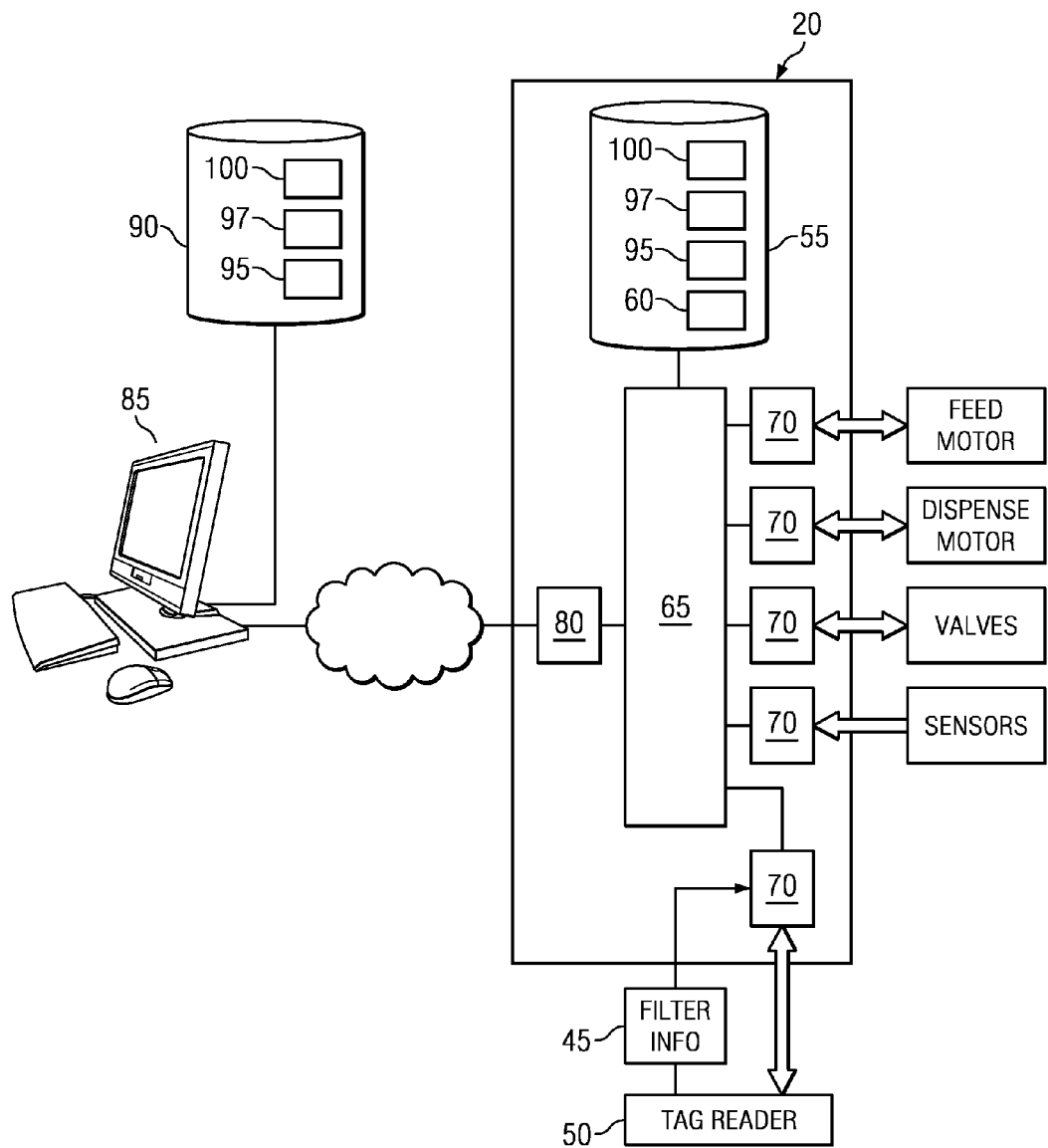
FIG. 11 is a diagrammatic representation of one embodiment of a system for controlling operation of a pump.

FIG. 11 is a diagrammatic representation of one embodiment of a system for controlling the operation of pump 25. Pump controller 20 can be onboard pump 25 or connected to pump 25 via one or more communications links for communicating control signals, data or other information. Pump controller 20 can be implemented as an onboard PCB board, remote controller or in other suitable manner. Additionally, the functionality of pump controller 20 can be distributed between an onboard controller and another controller.

According to one embodiment, pump controller 20 can include a computer readable medium 55 (e.g., RAM, ROM, Flash memory, optical disk, magnetic drive or other computer readable medium) containing a set of control instructions 60 for controlling the operation of multi-stage pump 20. A processor 65 (e.g., CPU, ASIC, RISC, DSP or other processor) can execute the instructions. One example of a processor is the Texas Instruments TMS320F2812PGFA 16-bit DSP (Texas Instruments is Dallas, Tex. based company). In another embodiment, instructions 60 can be implemented as hardware. Additionally, pump controller 20 can include a variety of computer components known in the art including additional processors, memories, interfaces, display devices, peripherals or other computer components not shown for the sake of simplicity.

A set of interfaces 70 can allow pump controller 20 to communicate serial, parallel or analog data/signals to motors, valves or other components and receive data/signals from sensors, tag reader 50, controllers or other components of pump 25. For example, pump controller 20 can send signals to feed motor 175 (see FIG. 2), dispense motor 200 (see FIG. 2), solenoids to control solenoid valves 440 (see FIG. 9) and other components of pump 25. Pump controller 20 can generate signals to directly control components or can generate signals that are interpreted by valve, motor or other controllers to operate components of pump 25. Pump controller 20 can also receive analog or digital signals from sensors, such as pressure sensor 112 (see FIG. 2), tag reader 50 and other components of pump 25. Interfaces 70 can include analog and digital interfaces as needed and there may be additional components between interfaces 70 and processor 65, such as, but not limited to, analog to digital converters, filters and other signal processing components.

According to one embodiment, pump controller 20 can also include an interface 80 to connect to a pump management system. Interface 80 can allow pump controller 20 to connect to a network (e.g., Ethernet, wireless network, global area network, DeviceNet network or other network known or developed in the art), a bus (e.g., SCSI bus) or other communications link. An I/O interface connector as described in U.S. Provisional Patent Application No. 60/741,657, entitled "I/O INTERFACE SYSTEM AND METHOD FOR A PUMP," by Cedrone et al., filed Dec. 2, 2005; and U.S. patent application Ser. No. 11/602,449, entitled "I/O SYSTEMS, METHODS AND DEVICES FOR INTERFACING A PUMP CONTROLLER," by Cedrone et al., filed Nov. 20, 2006 now issued as U.S. Pat. No. 7,940,664 on May 10, 2011, which are hereby fully incorporated by reference herein, can be used to connect pump controller 20 to a variety of interfaces and manufacturing tools.

Pump controller 20 can connect to a pump management system 85 that can provide instructions to pump controller 20 on the operation of pump 25. Pump management system 85 can be a computer or network of computers that connect to pump controller 20 to provide dispense recipes or other information to pump controller 20. Pump management system 85 can also collect operational data from pump controller 20. Pump management system 85 can connect to multiple pumps to provide centralized control and data collection. According to one embodiment, pump management system 85 can maintain a data repository 90 of operational data 97 collected from a number of pumps. Data repository can be a database, file system or other data storage system.

In operation, pump controller 20 can receive filter information 45 from tag reader 50. Pump controller 20 can execute instructions 60 to analyze information 45 and determine whether or how to operate pump 25. According to one embodiment, pump controller 20 can apply rules to information 45. As one example, pump controller 20 can compare information 45 to stored information 95 to determine whether to operate the pump. By way of example, but not limitation, this can include comparing a part number to an expected part number to determine if the filter is acceptable to be used with pump 25. Additionally, if the filter is acceptable, pump controller 20 can determine how to operate pump 25 based on filter information 45. In another embodiment, pump controller 20 can send filter information 45 to pump management system 85 and pump management system 85 can apply rules to determine whether or how to operate pump 25.

Stored information 95 can be provided to pump controller 20 through a user interface, by pump management system 85 or other can be otherwise provided. In one embodiment, pump controller 20 can store information 95 from a particular filter. For example, pump controller 20 can store filter information 45 from a filter as stored information 95.

Pump controller 20 can also store operational data 97 and correlate the operational data 97 to filter information 45. In another embodiment, pump controller 20 can forward operational data 97 to pump management system 85 and pump management system 85 can correlate the operational data 97 to filter information 45.

Analysis of the operational data versus various filter characteristics can be used to heuristically update the rules for determining whether and how to operate pump 25. For example, pump controller 20 may initially apply a rule such that a filter having a particular part number is acceptable. If over time it is discovered that filters having the acceptable part number and a first range of membrane bubble points resulted in good dispense coatings, but filters having the same part number and a second range of membrane bubble points resulted in an increased number of bad dispense coatings, the pump controller 20 or pump management system 85 can update the rules such that pump controller 20 will not operate with a filter having a membrane bubble point in the second range of membrane bubble points, even if the filter has an acceptable part number. Thus, analysis of data can be used to update the decision making of pump controller 20 or pump management system 85.

According to one embodiment, filter information 45 can be used to optimize the operation of pump 25. Pump controller 20 and/or pump management system 85 can maintain a library of operating routines 100. When filter information 45 is received, filter information and other parameters for a dispense can be used to determine the appropriate operating routine. For example, optimal operating routines can be empirically established for different filters and fluids and stored in library 100. Using the kinematic viscosity, fluid type or other parameter and at least some of filter information 45, pump controller 20 or pump management system 85 can access library 100 and determine the optimal operation of pump 25. Library 100 may include a library of complete dispense cycles or libraries of optimal segments of dispense cycles that optionally can be assembled into a complete dispense cycle. Library 100 can also include routines for priming a filter or other pump operations.

Figure 12:
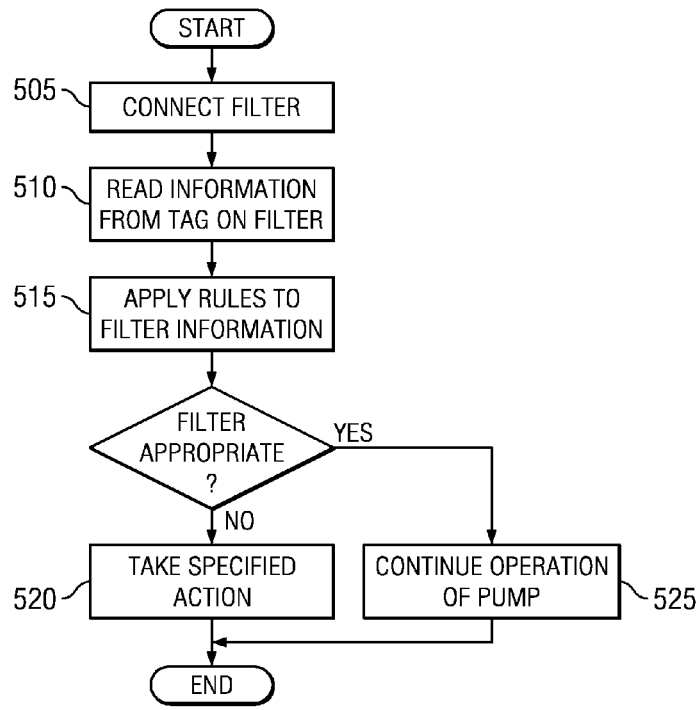
FIG. 12 is a flow chart illustrating of one embodiment of a method for affecting the operation of a pump using a filter information tag.

FIG. 12 is a diagrammatic representation of one embodiment of a method for controlling the operation of a pump based on filter information. Various processing steps in FIG. 12 can be performed by pump controller 20, pump management system 85 or other device. When a new filter is connected to a pump (step 505), an electronic tag reader can read a set of filter information from the tag (step 510). A set of rules can be applied to the filter information to determine if the filter is appropriate (step 515). The rules for determining whether a filter is appropriate can depend on the filter information and other factors, such as the process fluid, environmental properties, required cycle time or other factors. For example, a rule may be applied such that, if the process fluid has a certain viscosity, a filter will only be considered appropriate if it has a specific part number or certain part number and bubble point. Thus, the rules applied can depend on multiple pieces of filter information and other information. If the filter is not an appropriate filter, a corresponding action can be taken (step 520). Otherwise, operation of the pump can proceed (step 525).

According to one embodiment, a filter part number can be compared to an expected or allowable part number to determine if the part number matches (step 515). If the part number matches, operation of the pump can proceed (step 525). If the part number does not match, the pump controller (or other device) can determine that operation of the pump should not proceed (step 520). An alarm or notification can be generated to notify a pump management system or human user that the filter connected to the pump is not appropriate. The steps of FIG. 12 can be repeated as needed or desired.

If the filter is appropriate for a dispense operation, the filter information can be used to determine the operating routine of the pump. This can include determining the priming routine, the dispense cycle, particular segments of the priming routine or dispense cycle or otherwise determining how to operate the pump. According to one embodiment, the optimal priming routine and dispense cycle for the filter and fluid/fluid property combination can be determined.

In general, it is desirable to minimize the amount of time needed for priming and to run a dispense cycle. The type, number and length of segments in the dispense cycle and priming routine can depend on the characteristics of the filter being used, the dispense fluid and other factors. Embodiments can include a library of operating routines that specify optimal operating routines, cycles or segments.

Figure 13:
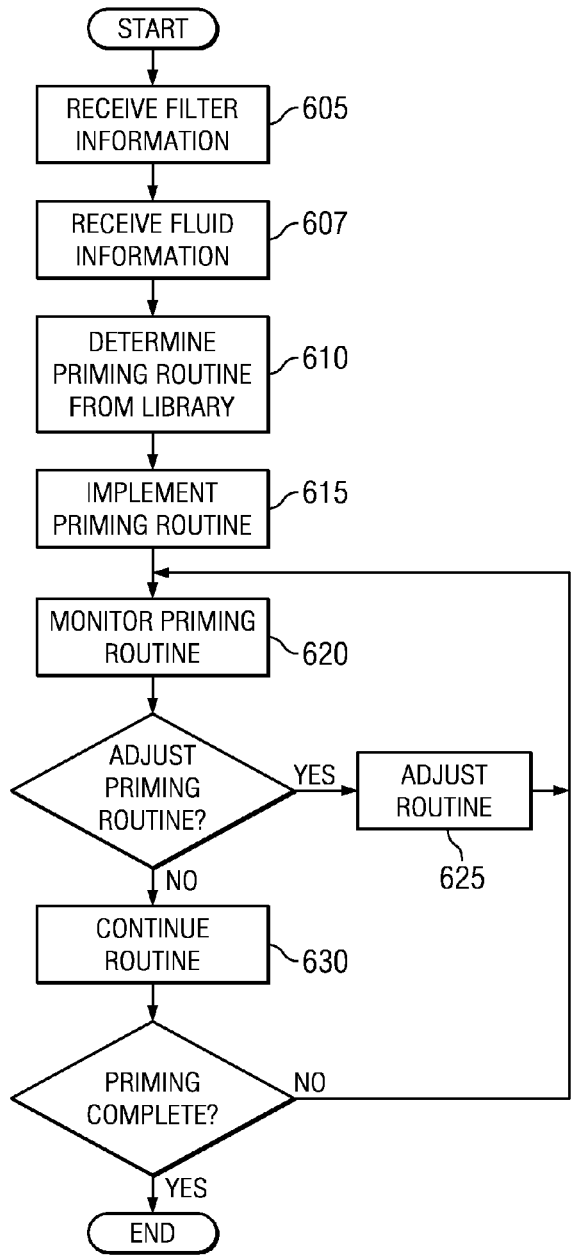
FIG. 13 is a diagrammatic representation of one embodiment of a method for optimizing priming of a pump.

FIG. 13 is a diagrammatic representation of one embodiment of a method for optimizing priming of a pump. Various processing steps in FIG. 13 can be performed by pump controller 20, pump management system 85 or other device. Filter information and fluid properties are gathered (steps 605 and 607). This can include, for example, receiving filter information stored on an electronically readable tag on the filter. Additional information that can be collected may include recipe information, a desired cycle time or other information. Using the filter information, fluid information and/or other information, a priming routine can be selected from a library of priming routines (step 610).

If pump management system 85 determines the optimal priming routine of the pump, pump management system 85 can provide the information necessary to pump controller 20 to implement the priming routine. After receiving the information for the priming routine (or after pump controller 20 determines the priming routine from the library), pump controller 20 can implement the priming routine (step 615).

The priming routine can be monitored (step 620) and adjusted (step 625). According to one embodiment, the priming routine can be adjusted by pump controller 20 on the fly. For example, the priming routine for a particular filter part number may specify a maximum pressure used during priming. However, the filter device flow may indicate that the individual filter can operate at a higher pressure. The pump controller 20 can adjust the priming routine to use a higher pressure and, therefore, prime in a shorter time. In another example, pump controller 20 may determine that the pressure during the priming routine is exceeding the pressure that should be expected during the priming routine. Pump controller 20 can slow the priming routine for that filter. Pump controller 20 may otherwise adjust the operation of the pump based on monitoring the operation of the pump and the filter information. Priming can continue until priming is complete or otherwise terminated (step 630). The steps of FIG. 13 can be repeated as needed or desired.

Figure 14:
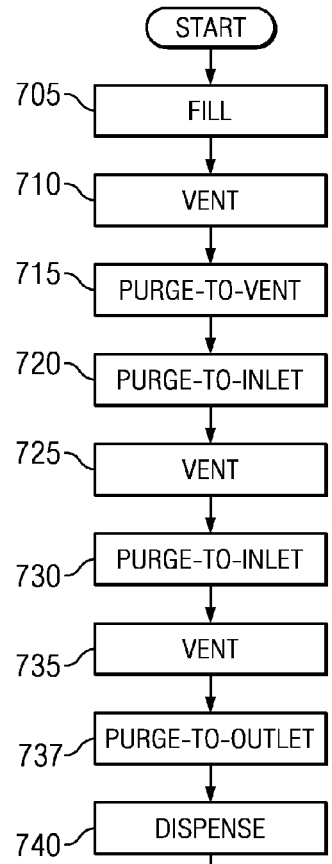
FIG. 14 is a flow chart illustrating one embodiment of a priming routine.
Figure 15:
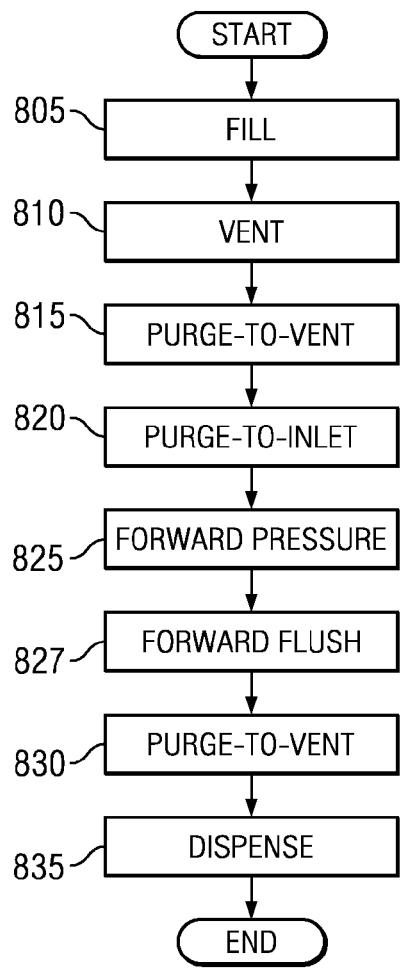
FIG. 15 is a flow chart illustrating another embodiment of a priming routine.
Figure 16:
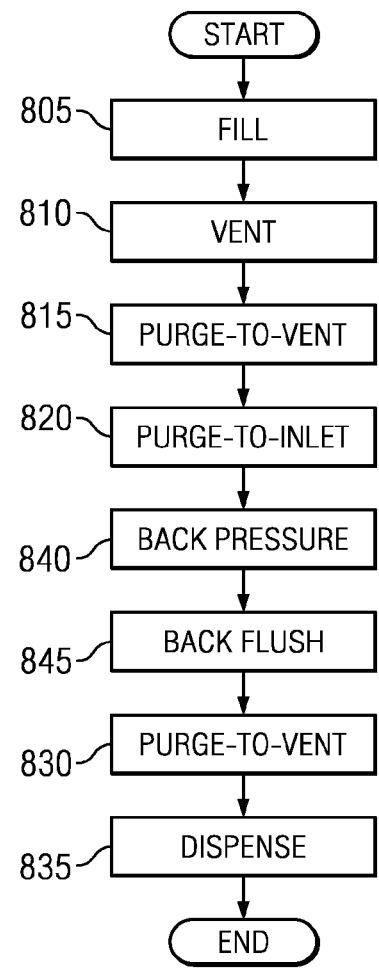
FIG. 16 is a flow chart illustrating yet another embodiment of a priming routine.

A priming routine can be selected to fully wet the filter before production dispense cycles occur. Any number of different priming routines can be stored in library 100 for various filters and fluid properties. FIGS. 14-16 are flow charts illustrating example priming routines. Each routine can involve a number of cycles that comprise several segments. In the following discussion, the following example cycles with constituent segments are used:

TABLE 2

| Cycle | Segments |
|---|---|
| Vent | Fill, Vent |
| Purge-to-Vent | Fill, Purge-to-Vent (dispense motor purges fluid back through feed chamber, to filter and out vent port), Filter, Vent, Purge-to-inlet (dispense motor purges fluid back to feed chamber and out inlet with inlet valve open). |
| Purge-to-Inlet | Fill, Purge-to-Inlet, Filter |
| Purge-to-outlet | Dispense, Fill, Filtration, Purge |

In a purge-to-vent segment, fluid is pushed to the dispense chamber and pushed from the dispense chamber through the purge valve, back to the feed chamber and out the vent valve. In a purge-to-inlet segment, fluid is pushed to the dispense chamber and then pushed from the dispense chamber, through the purge valve, back into to the feed chamber with the inlet valve open, without venting. The cycles and segments of Table 2 are provided by way of example and other cycles and segments can be used.

Referring to FIG. 14, inlet and outlet tubing can be filled (step 705) and a vent cycle performed (step 710). Next, a purge-to-vent cycle can occur (step 715). In the next step, a purge-to-inlet cycle can occur (step 720). This can be followed by a vent cycle (step 725), a second purge-to-inlet cycle (step 730), a final vent cycle (step 735) and a purge-to-outlet cycle (step 737). Finally, a dispense cycle is performed (step 740).

In the embodiment of FIG. 15, inlet and outlet tubing can be filled (step 805) and a vent cycle performed (step 810). Next, a purge-to-vent cycle can occur (step 815). During this cycle, the dispense chamber is filled with fluid and the barrier valve closed. The isolate and purge valves are opened. The dispense motor is run so that fluid flows out of the dispense chamber, through the feed chamber and out through the vent valve. In the next step, a purge-to-inlet cycle can occur (step 820).

Next, a filter priming cycle that includes a forward pressure segment (step 825) and a forward flush segment (step 827) can be performed. In the forward pressure segment the feed chamber is filled, the barrier and vent valves are closed and the isolation valve is opened. The feed stage motor runs to pressurize the fluid in the filter from upstream. In the forward pressure segment, fluid does not flow out of the filter. Pressurization occurs for a sustained period and generally at above the pressure setpoint used in the pre-filtration or filtration cycles. According to one embodiment, the fluid can be pressurized for 5-10 minutes at 5-25 psi, though higher or lower pressures and shorter or longer times can be used. The forward flush segment is similar to the purge-to-vent segment, but may occur at a relatively high rate so that if there is any dissolved gas, it can be pushed out of the filter through the vent. According to one embodiment, the forward flush is performed at or close to (e.g., at least 75% of) the maximum operating rate of the pump. For example, in an Entegris Intelligen Mini dispense system with a maximum dispense rate of 3 mL/sec, the forward flush can occur at 0.5 mL/sec-3.0 mL/sec, but preferably occurs at 2.25-3 mL/sec. A purge-to-vent cycle (step 830) and dispense cycle (step 835) can also be performed.

The embodiment of FIG. 16 is similar to that of FIG. 15 except that the filter priming cycle involves a back pressure step 840 rather than forward pressure step 825 and a back flush segment 845 rather than a forward flush segment 827. In back pressure step 840, the vent valve and isolation valve are closed and the barrier valve opened. The dispense motor is run to pressurize the fluid in the filter from downstream for a specified amount of time. In the back pressure segment, fluid does not flow out of the filter. Pressurization occurs for a sustained period and generally at above the pressure setpoint used in the pre-filtration or filtration cycles. According to one embodiment, the fluid can be pressurized for 5-10 minutes at 5-25 psi. In the back flush, the vent valve is opened and barrier valve opened. Fluid is run through the filter from the dispense chamber to vent. According to one embodiment, the back flush is performed at or close to (e.g., at least 75% of) the maximum operating rate of the pump. A purge-to-vent cycle (step 830) and dispense cycle (835) can also be performed.

The steps in FIGS. 14-16 can be repeated as needed or desired. In some cases each cycle will be repeated a number of times before moving on to the next step. Furthermore, the segments in a cycle or cycles in a routine can be performed in different orders. As another example, multiple forward pressure, forward flush, back pressure and back flush steps can be used in a single routine. Additional or alternative segments can be used in priming routines as needed or desired.

Various tests were conducted according to the methods of FIGS. 14, 15 and 16 using the Entegris Intelligen Mini dispense system. The tests were conducted varying both filtration rates and filtration pressures for each method. Various pressures and times were also tested for the forward pressure and back pressures steps. Table 3 provides example tests recipes for a method according to FIG. 14 that does not have a forward or back pressurization segment.

TABLE 3

| Cycle | No. of Cycles | Parameters |
| --- | --- | --- |
| Vent | 6 cycles | Vent Rate: 1.0 mL/sec<br>Fill Rate: 3.0 mL/sec |
| Purge-to-vent | 8 cycles | Filtration Rate<br>1) High: 3.0 mL/s<br>2) Low: .5 mL/s<br>Filtration Setpoint<br>1) High: 6 psi<br>2) Low: 1 psi<br>Vent Rate: 1.0 mL/sec<br>Purge Rate: 1.0 mL/sec<br>Fill Rate: 3.0 mL/sec |
| Purge-to-inlet | 20 cycles | Filtration Rate<br>1) High: 3.0 mL/s<br>2) Low: .5 mL/s<br>Filtration Setpoint<br>1) High: 6 psi<br>2) Low: 1 psi<br>Purge Rate: 1.0 mL/sec<br>Fill Rate: 3.0 mL/sec |
| Vent | 1 cycle | Vent Rate: 1.0 mL/sec<br>Fill Rate: 3.0 mL/sec |
| Purge-to-inlet | 40 cycles | Filtration Rate<br>1) High: 3.0 mL/s<br>2) Low: .5 mL/s<br>Filtration Setpoint<br>1) High: 6 psi<br>2) Low: 1 psi<br>Purge Rate: 1.0 mL/sec<br>Fill Rate: 3.0 mL/sec |
| Vent | 1 cycle | Vent Rate: 1.0 mL/sec<br>Fill Rate: 3.0 mL/sec |
| Purge-to-Outlet | 8 cycles | Dispense Rate: 1.0 mL/s<br>Filtration Rate<br>1) High: 3.0 mL/s<br>2) Low: .5 mL/s<br>Filtration Setpoint<br>1) High: 6 psi<br>2) Low: 1 psi<br>Purge Rate: 1.0 mL/sec<br>Fill Rate: 3.0 mL/sec |
| Dispense | Continuous | |

Table 4 provides example test recipes for a method that has a forward pressure segment.

TABLE 4

| Cycle | No. of Cycles | Parameters |
| --- | --- | --- |
| Vent | 6 cycles | Vent Rate: 1.0 mL/sec<br>Fill Rate: 3.0 mL/sec |
| Purge-to-vent | 8 cycles | Filtration Rate<br>1) High: 3.0 mL/s<br>2) Low: .5 mL/s<br>Filtration Setpoint<br>1) High: 6 psi<br>2) Low: 1 psi<br>Vent Rate: 1.0 mL/sec<br>Purge Rate: 1.0 mL/sec<br>Fill Rate: 3.0 mL/sec |
| Purge-to-inlet | 10 cycles | Filtration Rate<br>1) High: 3.0 mL/s<br>2) Low: .5 mL/s<br>Filtration Setpoint<br>1) High: 6 psi |

TABLE 4-continued

| Cycle | No. of Cycles | Parameters |
|---|---|---|
| | | 2) Low: 1 psi |
| | | Purge Rate: 1.0 mL/sec |
| | | Fill Rate: 3.0 mL/sec |
| Forward Pressure | 5 minutes | Pressures |
| | 10 minutes | 1) High: 25 psi |
| | | 2) Low: 10 psi |
| Purge-to-vent | 10 cycles | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Vent Rate: 1.0 mL/sec |
| | | Purge Rate: 1.0 mL/sec |
| | | Fill Rate: 3.0 mL/sec |
| Purge-to-Outlet | 15 cycles | Dispense Rate: 1.0 mL/s |
| | | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Purge Rate: 1.0 mL/sec |
| | | Fill Rate: 3.0 mL/sec |
| Dispense | Continuously | |

Table 5 provides example test recipes for the method that has a back pressure segment.

TABLE 5

| Cycle | No. of Cycles | Parameters |
|---|---|---|
| Vent | 6 cycles | Vent Rate: 1.0 mL/sec |
| | | Fill Rate: 3.0 mL/sec |
| Purge-to-vent | 8 cycles | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Vent Rate: 1.0 mL/sec |
| | | Purge Rate: 1.0 mL/sec |
| | | Fill Rate: 3.0 mL/sec |
| Purge-to-inlet | 10 cycles | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Purge Rate: 1.0 mL/sec |
| | | Fill Rate: 3.0 mL/sec |
| Forward Pressure | 5 minutes | Pressures |
| | 10 minutes | 1) High: 25 psi |
| | | 2) Low: 10 psi |
| Purge-to-vent | 10 cycles | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Vent Rate: 1.0 mL/sec |
| | | Purge Rate: 1.0 mL/sec |
| | | Fill Rate: 3.0 mL/sec |
| Purge-to-Outlet | 15 cycles | Dispense Rate: 1.0 mL/s |
| | | Filtration Rate |
| | | 1) High: 3.0 mL/s |
| | | 2) Low: .5 mL/s |
| | | Filtration Setpoint |
| | | 1) High: 6 psi |
| | | 2) Low: 1 psi |
| | | Purge Rate: 1.0 mL/sec |
| | | Fill Rate: 3.0 mL/sec |
| Dispense | Continuously | |

Tests according to the above recipes were performed using the same dispense recipe for continuous dispense cycles with the settings of Table 6:

TABLE 6

| Dispense | Max Dispense Volume: 10 mL |
|---|---|
| | Dispense Volume: 10 mL |
| | Dispense rate: 1 mL/sec |
| | Filtration rate: .5 mL/sec |
| | Vent Volume: 1 mL |
| | Vent Rate: 1 mL/sec |
| | Purge Volume .4 mL |
| | Purge Rate: 1 mL/sec |
| | Fill rate: 1 mL/sec |
| | Filter Set point 2 psi |
| | Ready Pressure 2 psi |

Testing was performed using PGME (propoylene glycol monomethyl ether) as the process fluid and the following filters by Entegris Inc., of Billerica, Mass.: A2AT20MK1—Impact2 V2 10 nm Symmetric UPE; A2ST20KM1 Impact 2 V2 Asymmetric 10 nm; A2SF20MK1 Impact 2 V2 Asymmetric 5 nm, and A2DT200K1 Impact 2 Duo 10 nm filters. After each priming routine was completed, the pump was run through continuous dispense cycles until the particle count (air bubble count) in the fluid dropped below a threshold amount (1 per 2 mL). In general, it was found that a method having a forward pressurization step was most effective for priming the Impact2 V2 Symmetric 10 nm, Impact 2 V2 Asymmetric 10 nm, Impact 2, V2 Asymmetric 5 nm filters.

It has been discovered, however, that routines using a back pressure segment provide significantly quicker priming for the A2DT200K1-10 nm Duo filter. Using the recipes of Table 5 and the following back pressure states: 25 psi for 5 minutes, 10 psi for 5 minutes, 10 psi for 10 minutes, 25 psi for 10 minutes resulted in the pump achieving an acceptable particle count in approximately half the time of the method of Table 3. The same priming routine, however, did not show as significant a benefit when applied to the single membrane filters.

Figure 17:
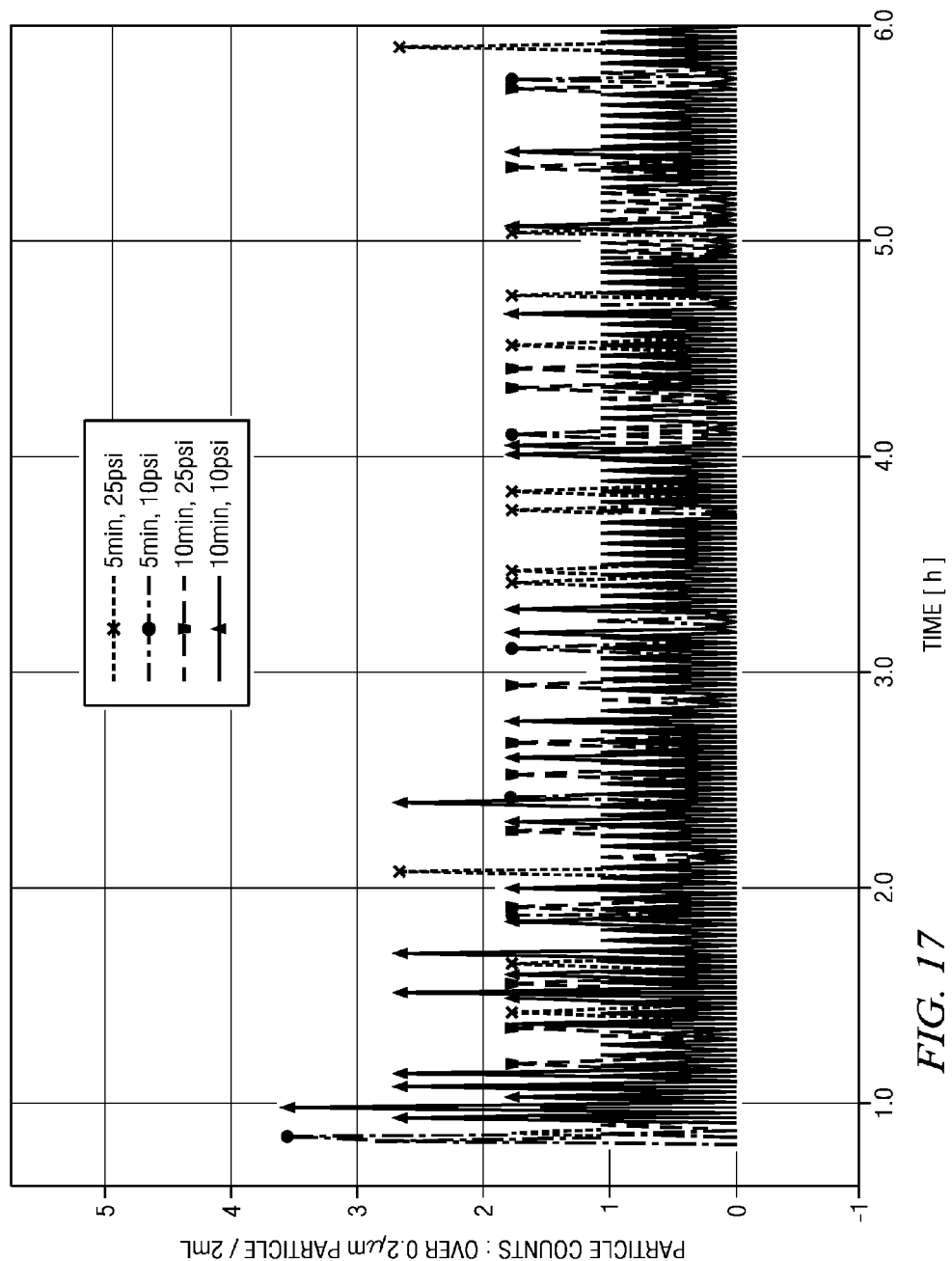
FIG. 17 is a chart of the results of priming a multiple membrane filter.

FIG. 17 provides results of the priming routine of FIG. 20, when used with the A2DT200K1-10 nm Duo filter. FIG. 17 illustrates the number of air bubbles over 0.2 um detected per 2 mL of PGME fluid dispensed. From the end of the priming sequence (t=0) using a back pressure segment of 10 psi for 10 minutes, it took approximately 3.2 hours of dispenses before the particle count (i.e., bubble count) was consistently below 1. Previous priming routines for the same filter could take up to nine hours to reach the same result. For the A2DT200K1-10 nm Duo filter, the tested pressures and times appeared to have minimal effect on overall time to reach an acceptable dispense.

As is clear from the foregoing, the priming routine can be selected based on the type of filter to minimize the time until the pump is ready. For some multiple membrane filters, it may be advantageous to select a priming routine that includes a back pressurization segment and back flush segment, whereas for single membrane filters it may be advantageous to select a priming routine that involves a forward pressure segment and forward flush segment. In other cases, it may be advantageous to select a priming routine that includes both forward and back pressurization segments and forward and back flush segments. In yet other embodiments, priming routines with forward pressurization and flush segments can be selected for multiple membrane filters and priming routines with back pressurization and flush segments can be selected for filters with single membranes.

Figure 18:
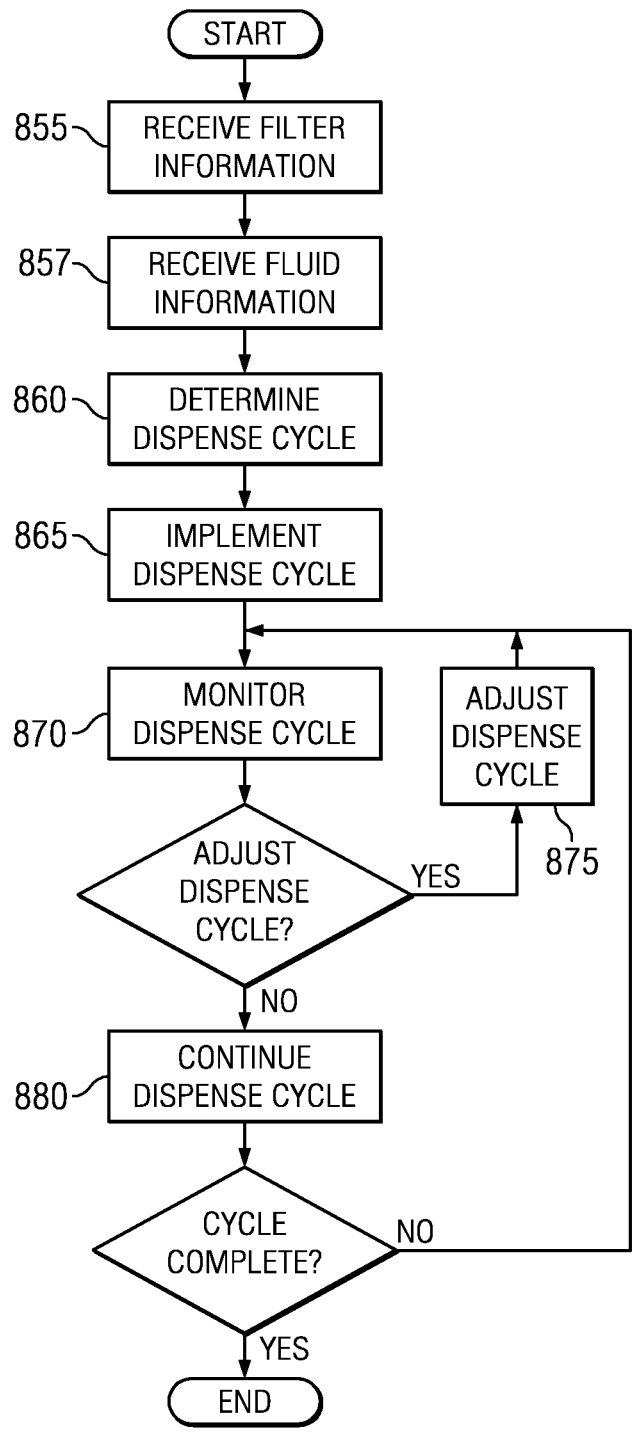
FIG. 18 is a diagrammatic representation of one embodiment of optimizing a dispense cycle for a pump.

The dispense cycle or particular segments of the pump dispense cycle also can be optimized. FIG. 18 is a diagrammatic representation of one embodiment of a method for optimizing the dispense cycle of a pump. Various processing steps in FIG. 18 can be performed by pump controller 20, pump management system 85 or other device. According to one embodiment, filter information and fluid properties are gathered (steps 855 and 857). This can include, for example, receiving filter information stored on an electronically readable tag on the filter. Other information that can be collected can include recipe information, cycle times or other information. Using the filter information, fluid information and/or other information the appropriate dispense cycle or portions of the dispense cycle can be determined from a library of operating routines (step 860). By way of example, but not limitation, the library may specify an optimal filtration routine that includes filtration and vent segments. Given the fluid properties, filter information or other information, the optimal filtration and vent timings for a dispense cycle can be determined. Thus, for example, for a 10 nm Symmetric UPE Filter and IPA, the library may specify that the pump should use its default venting segment, the filtration rate should be 0.3 mL/s, the filtration pressure should be 6 psi and the filtration segment should last 40 seconds. At step 865, pump controller 20 can implement the dispense cycle using the specified filtration routine.

According to one embodiment, the dispense cycle can be monitored (step 870). Based on the filter information and monitoring, the dispense cycle can be adjusted by pump controller 20 on the fly (step 875). For example, if the pressure during the dispense cycle begins to exceed the pressure allowable based on the device flow of the filter, this may indicate the filter is beginning to clog. The pump controller 20 can adjust the dispense cycle to decrease the pressure exerted by the pump. Pump controller 20 may otherwise adjust the operation of the pump based on monitoring the operation of the pump and the filter information. The dispense cycle can continue until the dispense cycle is complete (step 880) or otherwise terminated. The steps of FIG. 18 can be repeated as needed or desired.

Figure 19:
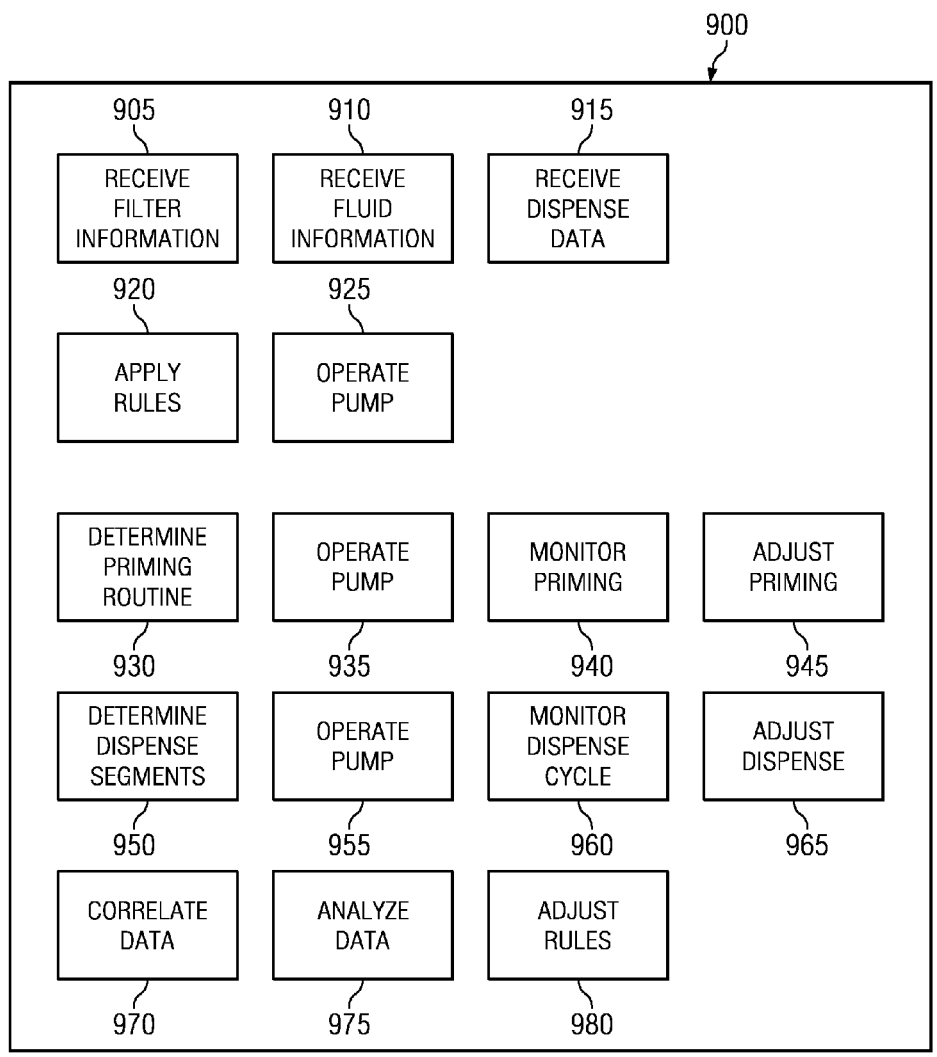
FIG. 19 is a diagrammatic representation of one embodiment of a software architecture.

FIG. 19 is a diagrammatic representation of one embodiment of a set of code 900 that can be distributed across multiple computers or run on a single computer. Code 900 can include filter information receiving code 905 that can receive filter information from a tag reader, through a user interface, over a communication link or otherwise receive filter information. Similarly code 900 can include fluid information receiving code 910 that can receive fluid information through a user interface, over a communication link or otherwise receive fluid information. Code 900 can further include operational data receiving code 915 that can receive operational data from sensors in a pump, receive operational data over a communications link from a pump or otherwise receive the operational data. Rules application code 920 can apply rules to the filter information to determine whether or how to operate a pump. Pump operation code 925 can operate the pump based on the output of rules application code 920 or take other specified action.

Priming routine determination code 930 can access a library of priming routines to determine an appropriate priming routine for the pump. Pump operation code 935 can operate the pump according to the priming routine determined by code 930. Priming monitoring code 940 can monitor the operational data of the pump during priming to determine whether to adjust the operation of the pump and priming adjustment code 945 can adjust the priming routine. Pump operation code 935 can operate the pump in accordance with the adjusted priming routine determine by priming adjustment code 945.

Dispense segment determination code 950 can access a library of dispense cycles or portions of a dispense cycle to determine how to operate the pump during priming. Pump operation code 955 can operate the pump according to the dispense cycle or dispense cycle segments determined by code 950. Dispense cycle monitoring code 955 can monitor the operational data of the pump during the dispense cycle to determine whether to adjust the operation of the pump and dispense cycle adjustment code 960 can adjust the dispense cycle. Pump operation code 965 can operate the pump in accordance with the adjusted dispense cycle or dispense cycle segment determine by dispense cycle adjustment code 965.

Data correlation code 970 can correlate operational data to filter information. Data analysis code can analyze the correlated data to identify filter characteristics that correspond to good and bad dispenses. Rules adjustment code 980 can adjust the rules applied by rules application code 920 based on the results of data analysis by code 975.

It should be noted that the code modules illustrated in FIG. 19 can be implemented as a monolithic program, any number of separate programs, functions of a program, functions of multiple programs or otherwise implemented according to a suitable software architecture and programming language. The functionality of code 900 can be distributed between multiple devices including, but not limited, a pump management system and a pump controller. Additionally, all or some of the functionality can be implemented as hardware or firmware.

It is believed that applying back pressure to the filter for a period of time removes larger air bubbles trapped at the upstream membrane. Therefore, embodiments described herein can apply priming routines that include a back pressure step when the filter has multiple membranes.

While various embodiments have been described in the context of a filter used in a liquid dispense pump, the present disclosure is not limited to such embodiments. For example, filter information tags can be used to store filter information on any type of filter. The filter information can be read by a tag reader and used to make a determination of whether or how to operate a device or system in which the filter is being used. For example, filter information tags can be used for filters in gas purification processes or other applications.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited to only those elements but may include other elements not expressly listed or inherent to such process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms.

Language designating such non-limiting examples and illustrations includes, but is not limited to: "for example," "for instance," "e.g.," "in one embodiment," and the like.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the disclosure. For example, while the foregoing primarily uses the example of a multi-stage pump, embodiments described herein can also be used with a single stage pump or other pumps. It is to be understood that the forms of the disclosure shown and described herein are to be taken as the presently preferred embodiments. Elements and materials may be substituted for those illustrated and described herein, parts and processes may be reversed, and certain features of the disclosure may be utilized independently, all as would be apparent to one skilled in the art after having the benefit of this description of the disclosure. Changes may be made in the elements described herein without departing from the spirit and scope of the claims.

What is claimed is:

1. A pump for semiconductor manufacturing comprising:
one or more motors to draw fluid into an inlet of the pump and dispense fluid from an outlet of the pump;
a removable filter disposed in a fluid flow path between the pump inlet and the pump outlet;
a pump controller configured to select a priming routine from a set of priming routines based on a filter type and process fluid, wherein the set of priming routines comprises:
a first priming routine that includes a forward pressurization segment for a first type of removable filter; and
a second priming routine that includes a back pressurization segment for a second type of removable filter;
wherein the controller is configured to control the pump to perform the selected priming routine to prime the removable filter.

2. The pump of claim 1, wherein the pump controller is configured to select the first priming routine for a removable filter having a single filter membrane.

3. The pump of claim 1, wherein the pump controller is configured to select the second priming routine for the removable filter having multiple filter membranes.

4. The pump of claim 1, wherein controlling the pump to perform the selected priming routine when the second priming routine is selected comprises introducing a process fluid to the removable filter and back-pressurizing the removable filter for a predetermined period of time.

5. The pump of claim 4, wherein the pump comprises:
a feed chamber;
a dispense chamber;
an isolation valve between the feed chamber and the removable filter;
a barrier valve between the removable filter and the dispense chamber; and
a vent valve in fluid communication with the removable filter; and
wherein back-pressurizing the removable filter comprises pressurizing fluid in the dispense chamber with the isolation and vent valves closed and the barrier valve open.

6. The pump of claim 4, wherein the pump controller is configured to control the pump to back-pressurize the removable filter for 5-10 minutes.

7. The pump of claim 6, wherein the pump controller is configured to control the pump to back-pressurize the removable filter at a constant pressure of at least 5-25 psi.

8. The pump of claim 1, wherein the second priming routine further comprises pushing fluid through the removable filter prior to back-pressurizing the removable filter.

9. The pump of claim 1, wherein the second priming routine comprises a vent cycle, a purge-to-vent cycle, a first purge-to-vent cycle, a purge-to-inlet cycle, a back flush, and a second purge-to-vent cycle.

10. The pump of claim 9, wherein the vent cycle, purge-to-vent cycle and purge-to-inlet cycle occur before back-pressurizing the removable filter and the back flush and second purge-to-vent cycle occur after back pressurizing the removable filter.

11. A method for priming a filter in a semiconductor manufacturing pump comprising:
connecting a removable filter to the pump;
selecting a priming routine for the removable filter based on a filter type and process fluid;
operating the pump according to the selected priming routine, wherein the operating the pump according to the selected priming routine comprises introducing a process fluid to the removable filter and back-pressurizing the removable filter for a predetermined period of time.

12. The method of claim 11, further comprising back-pressurizing the removable filter for 5-10 minutes.

13. The method of claim 12, further comprising back-pressurizing the removable filter at a constant pressure of 5-25 psi.

14. The method of claim 11, wherein the selected routine further comprises a vent cycle, a purge-to-vent cycle, a first purge-to-vent cycle, a purge-to-inlet cycle, a back flush, and a second purge-to-vent cycle.

15. The method of claim 14, wherein the vent cycle, purge-to-vent cycle and purge-to-inlet cycle occur before back-pressurizing the removable filter and the back flush and second purge-to-vent cycle occur after back pressurizing the removable filter.

16. A computer program product comprising a non-transitory storage medium storing a set of computer executable instructions comprising instructions executable to:
receive filter information and process fluid information;
select a priming routine for the removable filter based on the filter information and process fluid information;
operate a pump according to the selected priming routine, wherein operating the pump according to the selected priming routine comprises introducing a process fluid to the removable filter and back-pressurizing the removable filter for a predetermined period of time.

17. The computer program product of claim 16, wherein back-pressurizing the removable filter comprises back-pressurize the removable filter for 5-10 minutes.

18. The computer program product of claim 17, wherein back-pressurizing the removable filter comprises back-pressurize the removable filter at a constant pressure of 5-25 psi.

19. The computer program product of claim 16, wherein the priming routine further comprises a vent cycle, a purge-to-vent cycle, a first purge-to-vent cycle, a purge-to-inlet cycle, a back flush, and a second purge-to-vent cycle.

20. The computer program product of claim 19, wherein the vent cycle, purge-to-vent cycle and purge-to-inlet cycle are performed multiple times before back-pressurizing the removable filter and the back flush and second purge-to-vent cycle occur after back pressurizing the removable filter.

* * * * *